(12) United States Patent
Terui et al.

(10) Patent No.: US 7,696,009 B2
(45) Date of Patent: Apr. 13, 2010

(54) METHOD FOR FABRICATING A SEMICONDUCTOR DEVICE HAVING A HEAT RADIATION LAYER

(75) Inventors: Makoto Terui, Yamanashi (JP); Yasuo Tanaka, Tokyo (JP); Takashi Noguchi, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 319 days.

(21) Appl. No.: 11/471,554

(22) Filed: Jun. 21, 2006

(65) Prior Publication Data

US 2006/0246625 A1    Nov. 2, 2006

Related U.S. Application Data

(62) Division of application No. 10/717,934, filed on Nov. 21, 2003, now Pat. No. 7,078,265.

(30) Foreign Application Priority Data

Nov. 22, 2002    (JP)    ............................. 2002-339332

(51) Int. Cl.
*H01L 21/00* (2006.01)
(52) U.S. Cl. ..................... 438/113; 438/114; 438/126; 438/127; 257/E21.7; 257/E21.702; 257/E21.705
(58) Field of Classification Search ................. 438/113, 438/114, 126, 127; 257/E21.7, E21.702, 257/E21.705
See application file for complete search history.

(56) References Cited

U.S. PATENT DOCUMENTS

| | | | |
|---|---|---|---|
| 5,858,145 A | 1/1999 | Sreeram et al. | |
| 6,104,596 A | 8/2000 | Hausmann | |
| 6,184,579 B1 | 2/2001 | Sasov | |
| 6,300,167 B1 * | 10/2001 | Raleigh et al. | 438/122 |
| 6,544,821 B2 | 4/2003 | Akram | |
| 6,627,814 B1 * | 9/2003 | Stark | 174/539 |
| 6,723,379 B2 * | 4/2004 | Stark | 427/180 |
| 7,078,265 B2 * | 7/2006 | Terui et al. | 438/113 |
| 2001/0001740 A1 * | 5/2001 | Miyawaki | 438/700 |
| 2001/0051392 A1 * | 12/2001 | Akram | 438/106 |
| 2002/0004288 A1 * | 1/2002 | Nishiyama | 438/464 |
| 2003/0155987 A1 * | 8/2003 | Kolb et al. | 333/12 |
| 2003/0188881 A1 * | 10/2003 | Stark | 174/52.4 |
| 2004/0104460 A1 * | 6/2004 | Stark | 257/678 |
| 2004/0113283 A1 | 6/2004 | Farnworth et al. | |

FOREIGN PATENT DOCUMENTS

| | | |
|---|---|---|
| JP | 09-064049 | 3/1997 |
| JP | 09-275169 | 10/1997 |
| JP | 10-279845 | 10/1998 |
| JP | 11-067998 | 3/1999 |
| JP | 2001-250872 | 9/2001 |

* cited by examiner

*Primary Examiner*—Jarrett J Stark
(74) *Attorney, Agent, or Firm*—Volentine & Whitt, P.L.L.C.

(57) ABSTRACT

A fabricating method for a semiconductor device includes forming a heat spreading material on rear surface of the semiconductor wafer. The semiconductor wafer has a plurality of device areas and scribe lines which are arranged between the device areas. After the heat spreading material is formed on rear surface of the semiconductor wafer, the semiconductor wafer is separated at the scribe lines.

12 Claims, 19 Drawing Sheets

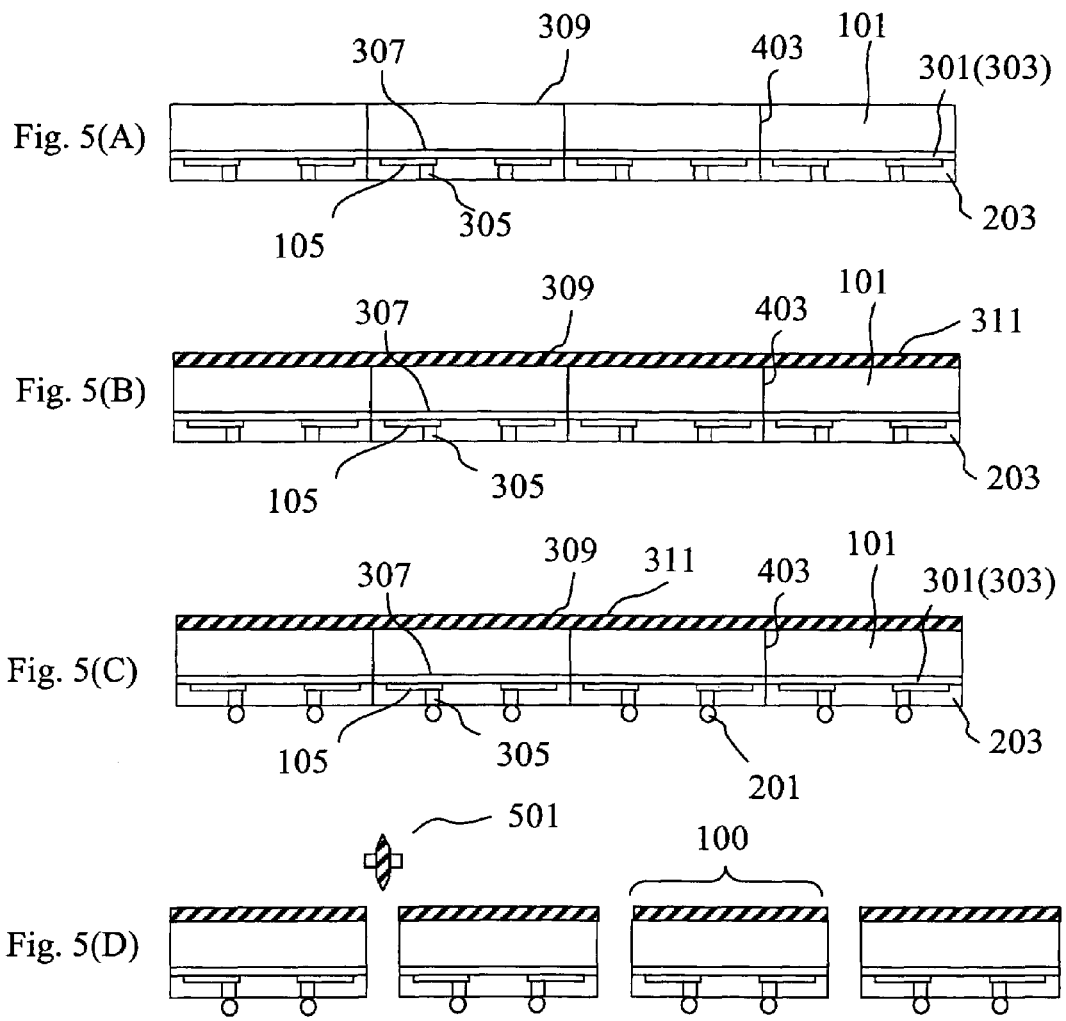

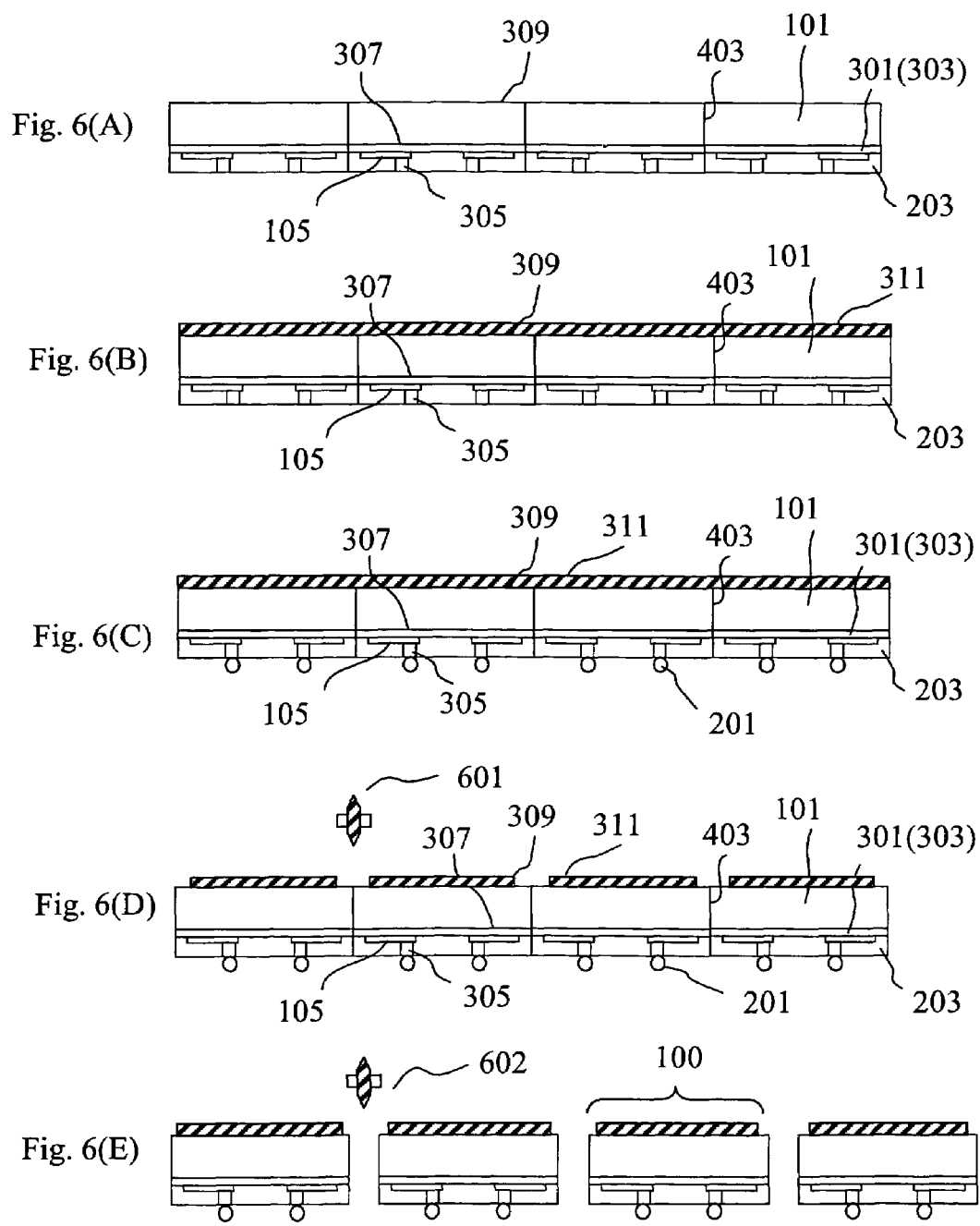

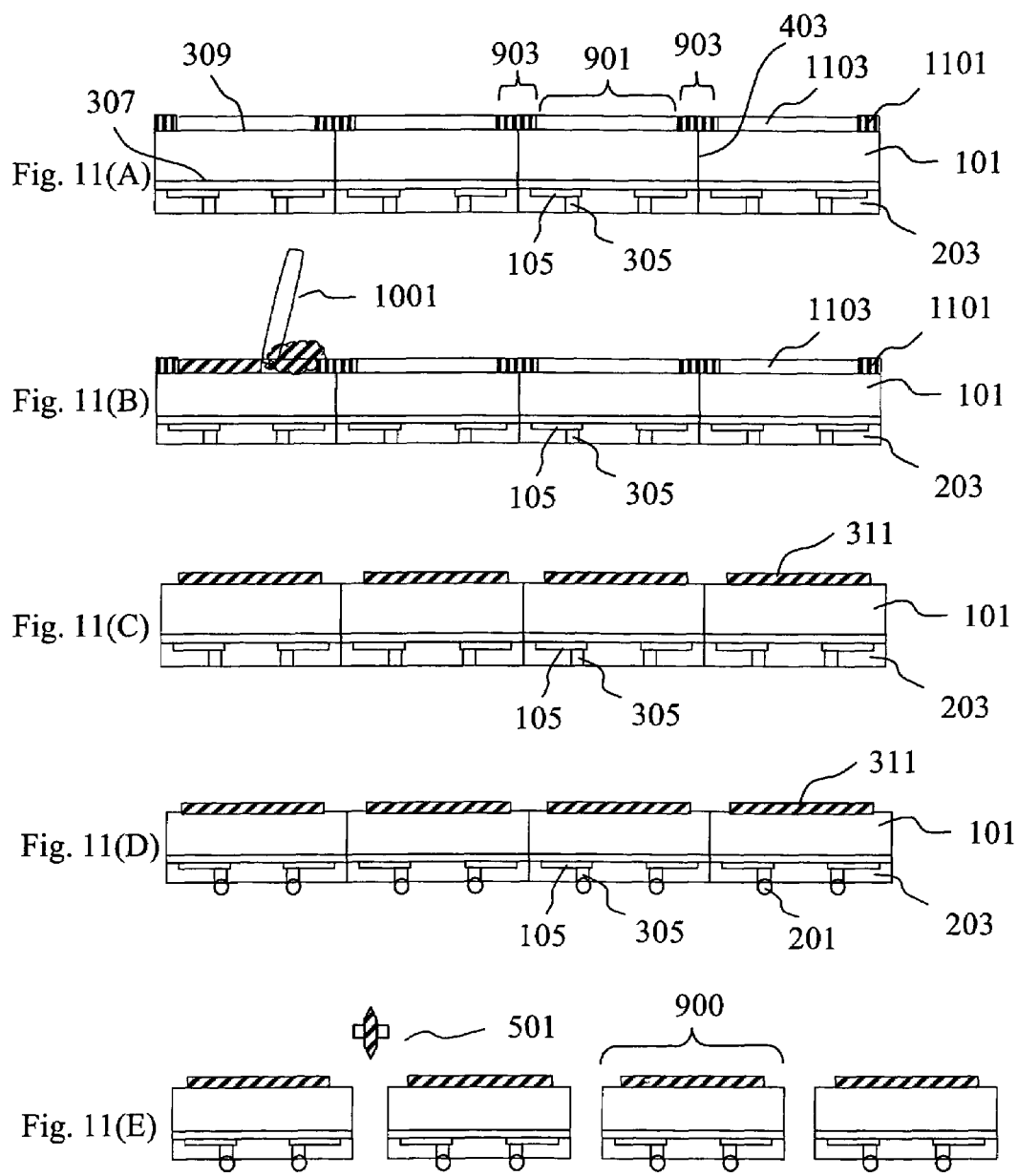

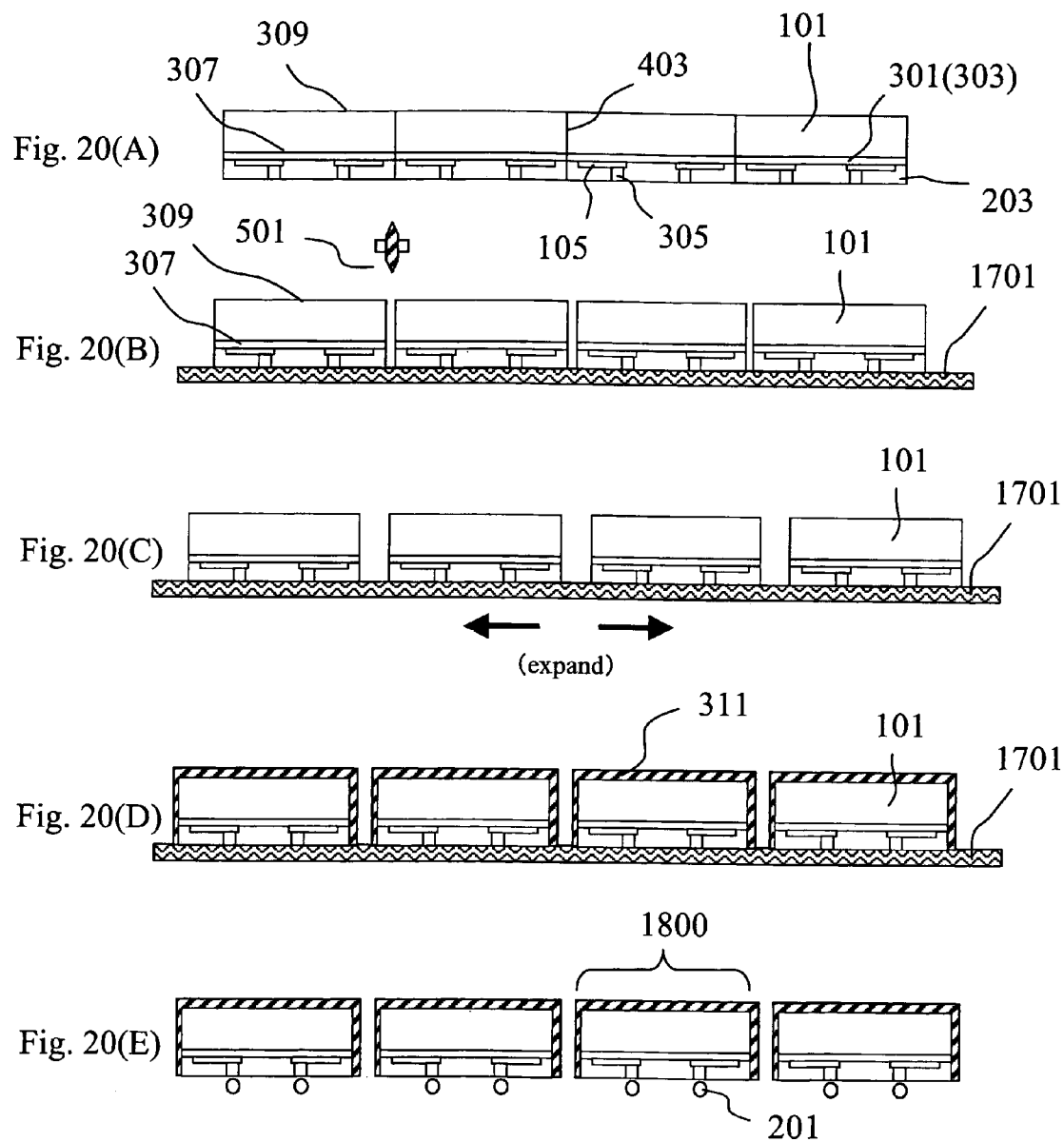

METHOD FOR FABRICATING A SEMICONDUCTOR DEVICE HAVING A HEAT RADIATION LAYER

This application is a divisional application of application Ser. No. 10/117,934, filed on Nov. 21, 2003, now U.S. Pat. No. 7,078,265, which is hereby incorporated by reference in its entirety for all purposes.

CROSS REFERENCE TO RELATED APPLICATION

A claim of priority under 35 U.S.C. §119 is made to Japanese Patent Application No. 2002-339332, filed Nov. 22, 2002, which is herein incorporated by reference in its entirety for all purposes.

BACKGROUND OF THE INVENTION

1. Field of the Invention

The present invention relates to a semiconductor device having a heat spreading layer.

2. Description of the Related Art

In a semiconductor device used in a portable device, downsizing of the semiconductor device is needed. A package called a Chip Size Package (hereinafter, called CSP) has therefore been developed. The CSP is similar in size to a semiconductor chip. A type of CSP is called a wafer level chip size package (Wafer Level Chip Size Package: WCSP) or wafer level chip scale package (Wafer Level Chip Scale Package: WCSP). Such a WCSP is described in Japanese Issued Patent No-3313547.

Recently, portable devices have been operated using a high speed clock. The semiconductor device used in the portable device is operated by a high speed clock. However, as a result of increasing the clock speed, electric power used in the semiconductor chip is increased. Also, as the number of transistors included in the semiconductor chip is increased, the electric power used in the semiconductor device is increased. Since electric power is increased, heat generated by the semiconductor device increases.

For radiating the heat generated by the semiconductor device, a heat radiating part is attached on the semiconductor chip. However, the heat radiating part increases the size of the semiconductor device. That is, the heat radiating part negates the beneficial effect of the WCSP.

A semiconductor device that has an improved heat radiation feature without the use of a heat radiating part has been described in Japanese patent Laid-Open No. 1999-67998. The semiconductor device disclosed in the reference has a film on the surface of the semiconductor device that has a function of heat radiation. However, the reference does not disclose a timing of forming the film. That is, the reference does not consider productivity.

SUMMARY OF THE INVENTION

Accordingly, in one aspect of the present invention, a method for fabricating a semiconductor device having a heat spreading layer with improved productivity is disclosed. The fabricating method for a semiconductor device of this invention includes forming a heat spreading material on rear surface of the semiconductor wafer. The semiconductor wafer has a plurality of device areas and scribe lines which are arranged between the device areas. After the heat spreading material is formed on the rear surface of the semiconductor wafer, the semiconductor wafer is separated by the scribe lines.

BRIEF DESCRIPTION OF THE DRAWINGS

FIGS. 5(A) to 5(D) are views showing fabricating steps for a semiconductor device of the first embodiment of the invention.

FIG. 6(A) to 6(E) are views showing fabricating steps for a semiconductor device of a variation of the first embodiment of the invention.

FIGS. 11(A) to 11(E) are views showing fabricating steps for a semiconductor device of the fifth embodiment of the invention.

FIGS. 20(A) to 20(E) are views showing fabricating steps for a semiconductor device related to tenth embodiment of the invention.

DETAILED DESCRIPTION OF THE PREFERRED EMBODIMENTS

Figure 1:
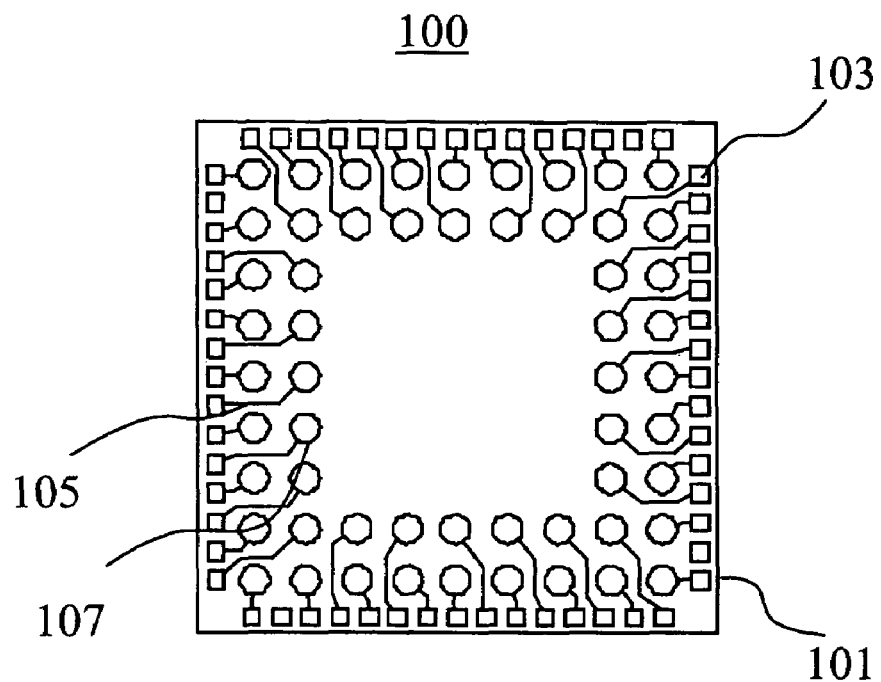
FIG. 1 is a plane view showing a surface of a semiconductor device without a sealing resin in a first embodiment of the present.

A method for fabricating a semiconductor device according to preferred embodiments of the present invention will be explained hereinafter with reference to the accompanying figures. In order to simplify the explanation, like elements are given like or corresponding reference numerals. Dual explanations of the same elements are avoided.

First Preferred Embodiment

Figure 2:
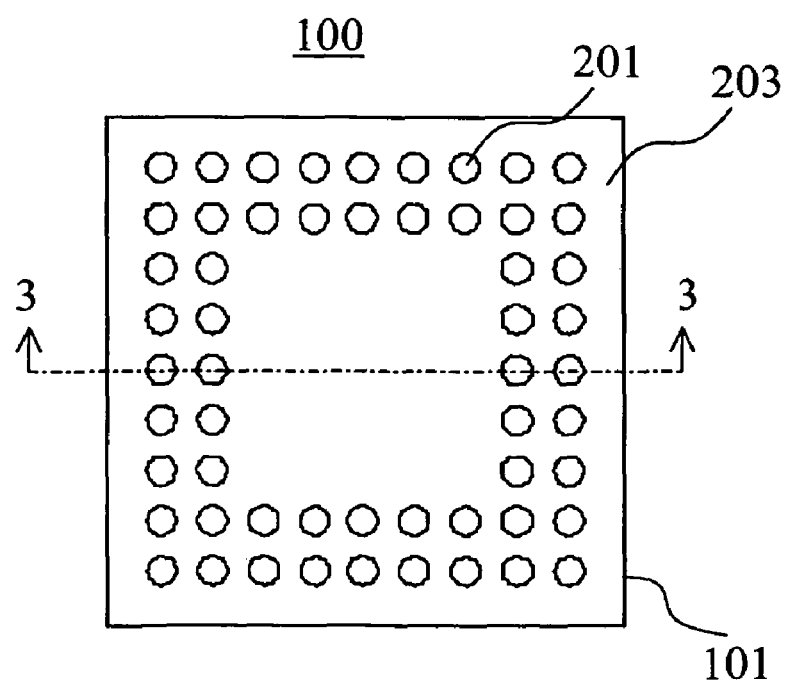
FIG. 2 is a plane view showing a surface of a semiconductor device with the sealing resin in a first embodiment of the present invention.
Figure 3A:
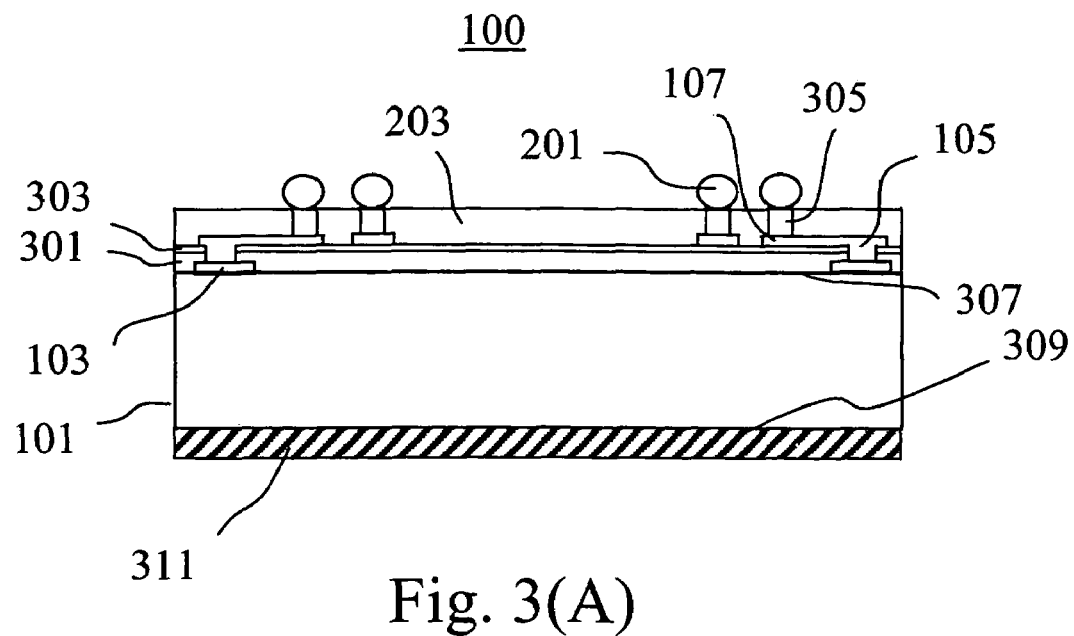
FIG. 3(A) is a cross-sectional view at the line 3-3 of the FIG. 2.
Figure 3B:
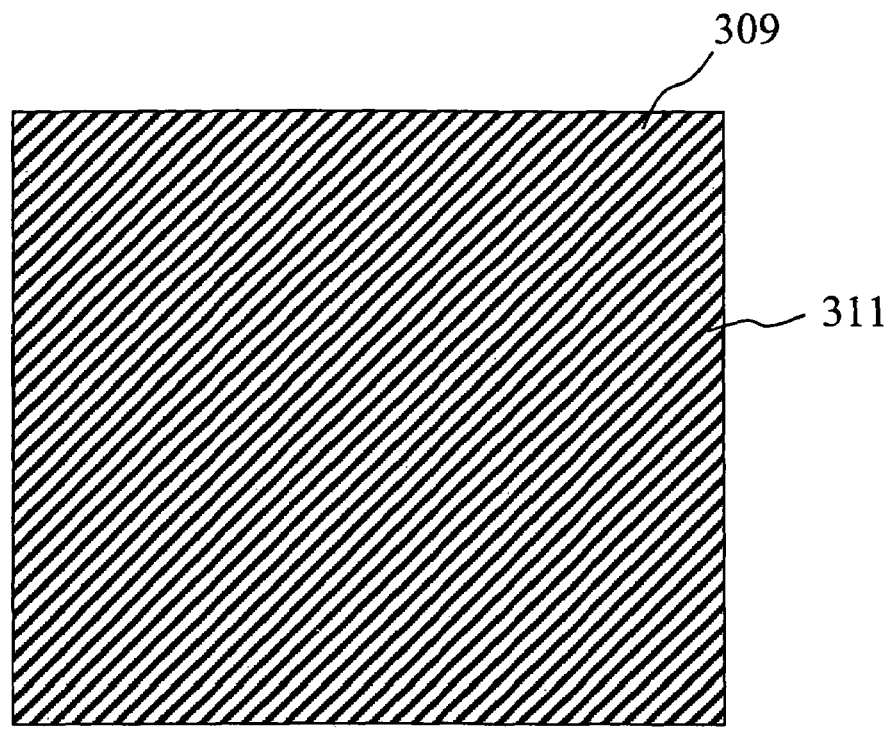
FIG. 3(B) is a plane view showing a rear surface of the semiconductor device of the first embodiment.

FIG. 1 is a plane view showing a top surface of a semiconductor device 100 related to a first embodiment of the present invention. FIG. 1 shows the top surface of the semiconductor device 100 before being sealed by a sealing resin. FIG. 2 is a plane view showing a top surface of the semiconductor device 100 after being sealed by the sealing resin. FIG. 3(A) is a cross-sectional view at a line 3-3 of FIG. 2. FIG. 3(B) is a plane view showing a rear surface 309 of the semiconductor device 100.

The semiconductor device 100 in the present invention is the WCSP. As shown in FIG. 1 and FIG. 2, an outside dimension of the semiconductor device 100 is substantially the same as an outside dimension of a semiconductor substrate 101. The semiconductor device 100 square shaped with 8 mm sides.

The semiconductor device 100 includes the semiconductor substrate 101. A circuit element including a transistor, resistor, capacitor or inductor is formed on a surface 307 of the semiconductor substrate 101. A plurality of electrode pads 103 each of which is connected to the circuit element is formed on the surface 307 of the semiconductor substrate 101. The semiconductor substrate 101 has a heat spreading film 311 on a rear surface 309 of the semiconductor substrate.

The heat spreading film 311 ranges from 5 μm to 200 μm in thickness. A heat radiating ratio of the heat spreading film 311 is higher than that of the semiconductor substrate 101. Since the semiconductor device 100 has the heat spreading film 311, the heat generated in the semiconductor chip 101 is radiated effectively. The heat spreading film 311 converts heat energy into infrared energy. As a result, the heat spreading film 311 has high heat radiating ratio. Japanese Patent Lied-Open No. 1998-279845 describes a paint including ceramic powder. Such paint can be used as the heat spreading film 311 in this embodiment.

An insulating layer 301 such as silicon dioxide is formed on the semiconductor substrate 101. The electrode pads 103 are exposed from the insulating layer 301. A passivation layer 303 such as polyimide is formed on the insulating layer 301.

Wirings 105 such as copper are formed on the passivation layer 303. First ends of the wirings 105 are connected to the electrode pads 103 via the openings. The other ends of the wirings 105 have a land portion 107. The land portions 107 are located at a central portion of the semiconductor device 100 relative to the electrodes 103. Post electrodes 305 such as copper are formed on the land portions 107. The wirings 105 connect the electrodes 103 to the post electrodes 305. External terminals 201 are formed on the post electrodes 305. As a result, the external terminals 201 such as solder are shifted from a peripheral position of the electrodes 103 to the central position. Generally, the wiring for shifting the electrode position is called redistribution. Hereinafter, the wirings 105 may be called redistributions 105.

A sealing resin 203 such as epoxy resin is formed on the semiconductor substrate 101. The tops of the post electrodes 305 are exposed from the sealing resin 203.

The external terminals 201 are formed on the top surface of the post electrodes 305. As shown in FIG. 2, the external terminals are arranged regularly on the semiconductor substrate 101. In this embodiment, the external terminals 201 are arranged two lines.

Now, a method for fabricating the semiconductor device 100 of the first preferred embodiment is described.

Figure 4:
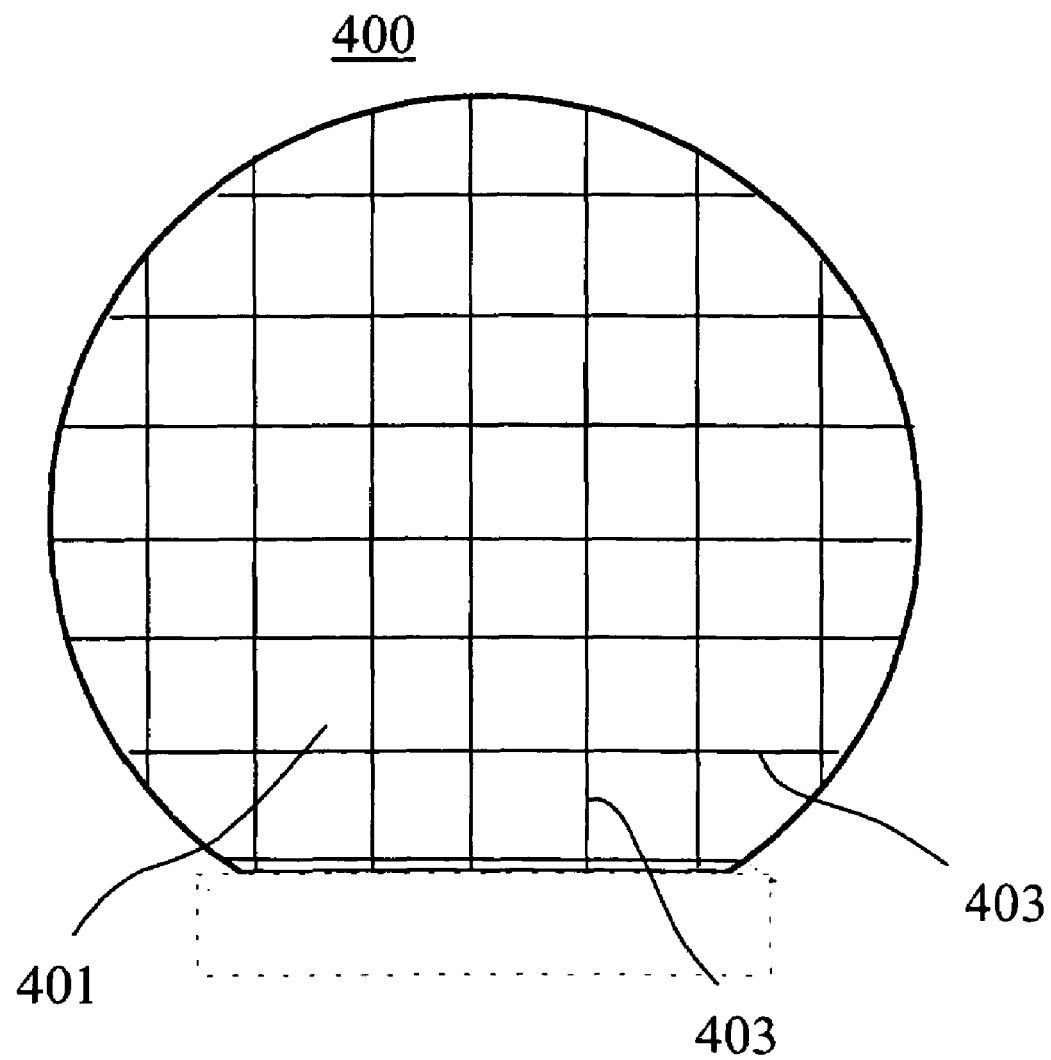
FIG. 4 is a plane view showing a rear surface of a semiconductor wafer.

FIG. 4 is a plane view showing a rear surface 309 of a semiconductor wafer 400. FIGS. 5(A) to 5(D) are views showing fabricating steps for a semiconductor device 100 related to first embodiment of the invention.

First, the semiconductor wafer 400 is provided as shown in FIG. 4. A plurality of semiconductor device forming areas 401 is defined by scribe lines 403 on the semiconductor wafer 400.

The insulating layer 301, the passivation layer 303, the redistributions 105, the post electrodes 305 and the sealing resin 203 are formed on the front surface 307 of the semiconductor wafer 401, as shown in FIG. 5(A). The process steps are disclosed in Japanese Patent No. 3313547.

Then, the heat spreading film 311 is formed on the rear surface 309 of the semiconductor wafer 400, as shown in FIG. 5(B). A liquid type heat spreading material is supplied on the rear surface 309 on the semiconductor wafer 400 by spray coating or printing. The liquid type heat spreading material is dried and solidified. The solidified heat spreading material is the heat spreading film 311.

Next, the external terminals 201 are formed on the post electrode 305, as shown in FIG. 5(C). In the alternative, the external terminals 201 can be formed before the heat spreading material is formed.

As shown in FIG. 5(D), the semiconductor devices 100 are divided at the scribe line 403 used by a dicing blade 501.

In the process shown in FIG. 5(D), the semiconductor wafer 400 is divided by one dicing blade 501. However, following process shown in FIG. 6 can be applied in this embodiment.

First, processing in FIGS. 6(A) to 6(C) is carried out, which is identical to that in FIG. 5(A) to 5(C), so that description thereof is omitted. Then, the heat spreading film 311 on rear surface 309 is divided by a first dicing blade 601 under a first condition, as shown in FIG. 6(D). Next, the semiconductor substrate 101 and the sealing resin 203 are cut by a second blade 602 under a second condition, as shown in FIG. 6(E). As comparing the first condition and the second condition, a revolution speed of the first blade is slower than that of the second blade, a width of the first blade is wider than that of the second blade, a diamond density of the first blade is higher than that of the second blade and a grain size of the diamond in the first blade is smaller than that of the second blade. In the process steps shown in FIGS. 6(A) to 6(E), the blades are changed depending on the object to be cut. As a result, a lifetime of the blades can be extended.

As a result of forming the heat spreading film 311 on the rear surface 309 of the semiconductor substrate 101, the heat generated in the semiconductor device is radiated from the heat spreading film 311 effectively. As a result, a thermal resistance of the WCSP is reduced by a factor within a range of from 5% to 20% as compared to a semiconductor device that does not used a heat spreading layer. Therefore, a circuit that consumes a high power can be used in the WCSP. According to this embodiment, the heat generated in the semiconductor device can be radiated effectively without attaching an external heat radiating fin to the semiconductor substrate 101.

According to the method for fabricating the semiconductor device of the present invention, the heat spreading film 311 is formed on the rear surfaces 309 of the semiconductor substrates 101, before the wafer 400 is divided. That is, the heat spreading film 311 is not formed on the respective semiconductor substrates 101 individually. As a result, the productivity of the WCSP is increased.

Second Preferred Embodiment

Figure 7A:
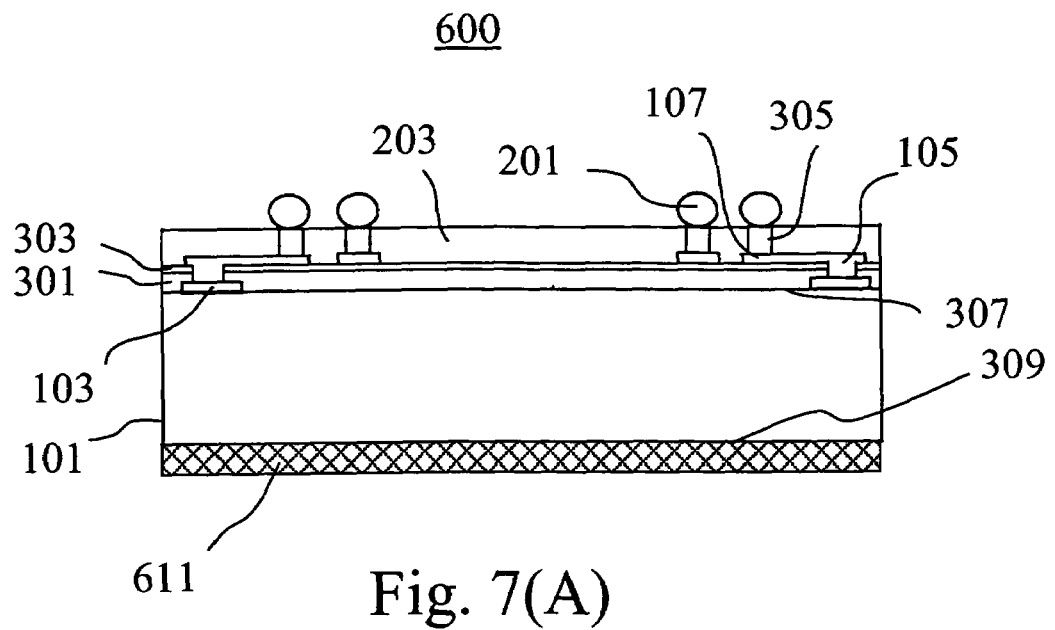
FIG. 7(A) is a cross-sectional view showing a semiconductor device of a second embodiment of the present invention.
Figure 7B:
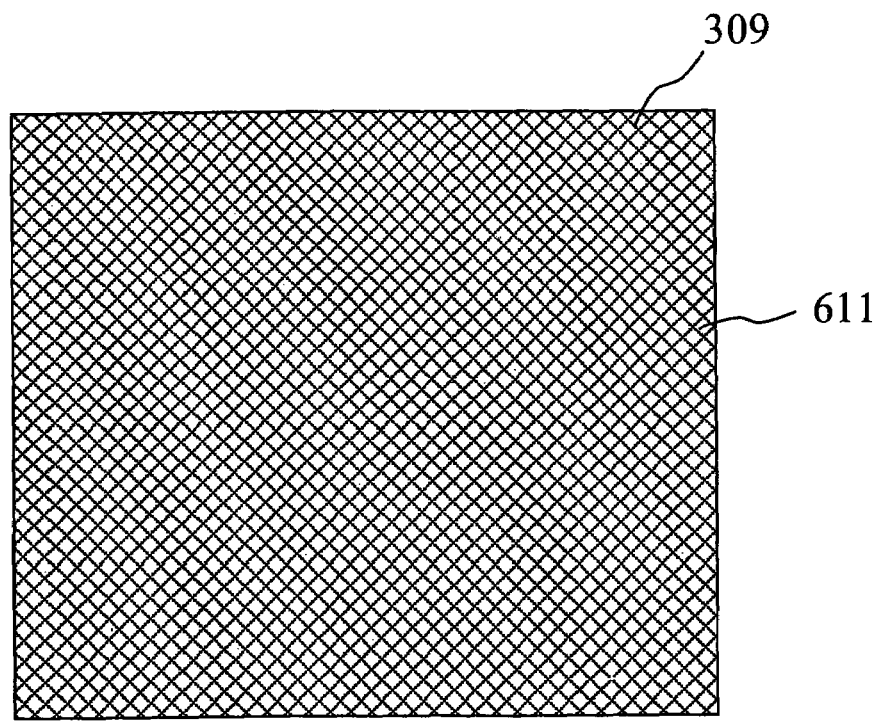
FIG. 7(B) is a plane view showing a rear surface of the semiconductor device of the second embodiment of the present invention.

FIG. 7(A) is a cross-sectional view showing a semiconductor device 600 related to a second embodiment of the present invention. FIG. 7(B) is a plane view showing a rear surface 309 of the semiconductor device related to the second embodiment of the present invention.

In the second embodiment, a material of the heat spreading film 611 is different from that of the heat spreading film 311 disclosed at the first embodiment. That is, the heat spreading film 611 ranges from 5 μm to 200 μm in thickness. A heat radiating ratio of the heat spreading film 611 is higher than that of the semiconductor substrate 101. The heat spreading film 611 includes a black pigment.

Since the semiconductor device 600 has the heat spreading film 611, the heat generated in the semiconductor chip 101 is radiated effectively. The heat spreading film 611 converts heat energy into infrared energy. As a result, the heat spreading film 611 has high heat radiating ratio. A heat spreading film with black pigment has better heat radiating efficiency than a heat spreading film with white pigment. In this embodiment, such an advantage based on color is applied. In this embodiment, the heat spreading film 611 may include a stack structure of a heat spreading film without black pigment and a heat spreading film with black pigment.

According to the method for fabricating the semiconductor device of the present invention, heat spreading film 611 is formed on the rear surfaces 309 of the semiconductor substrates 101 all together before the wafer 400 is divided. That is, the heat spreading film 611 is not formed on the respective semiconductor substrates 101 individually. As a result, the productivity of the WCSP is increased.

Third Preferred Embodiment

Figure 8A:
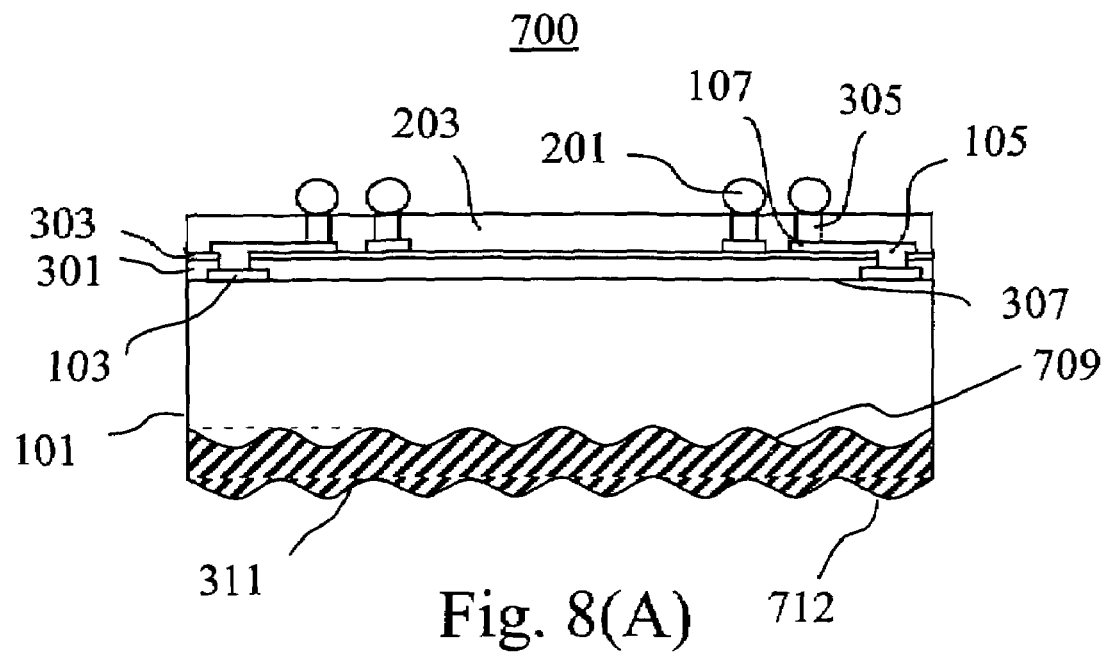
FIG. 8(A) is a cross-sectional view showing a semiconductor device of a third embodiment of the present invention.
Figure 8B:
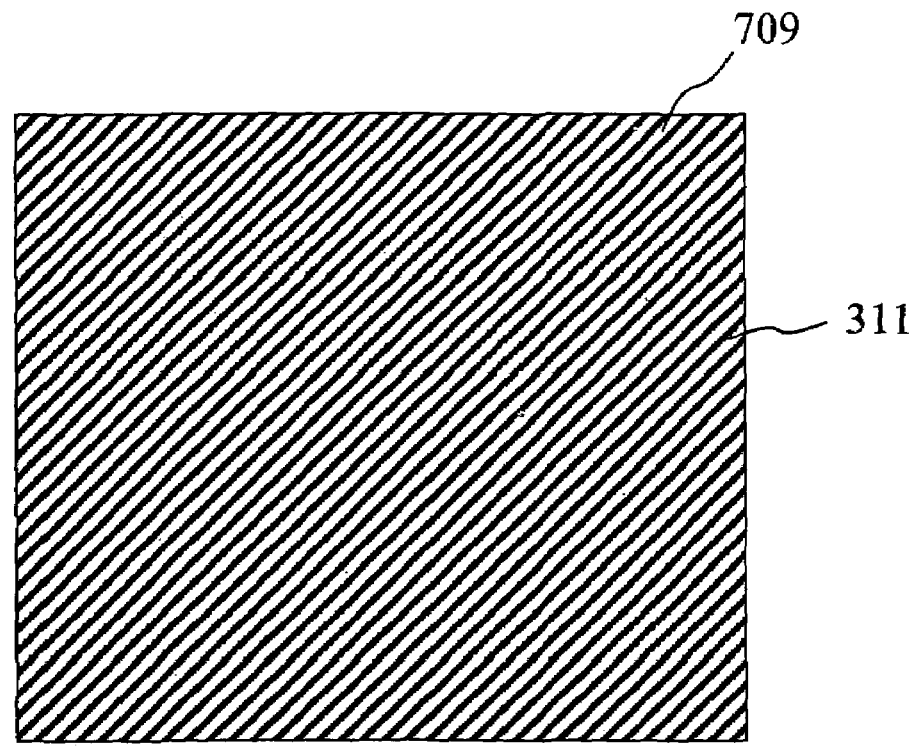
FIG. 8(B) is a plane view showing a rear surface of the semiconductor device of the third embodiment of the present invention.

FIG. 8(A) is a cross-sectional view showing a semiconductor device 700 related to a third embodiment of the present invention. FIG. 8(B) is a plane view showing a rear surface 709 of the semiconductor device related to the third embodiment of the present invention.

The semiconductor device of the third embodiment is different from the semiconductor device of the first embodiment with respect to the structure of the rear surface 709. Other aspects of the structure of the third embodiment are the same as the semiconductor device of the first embodiment.

In the WCSP, a predetermined thickness of the rear surface 709 of the semiconductor substrate 101 is removed so as to provide an appropriate relationship between a thickness from the top surface 307 of the semiconductor substrate 101 to the rear surface 709 of the semiconductor substrate 101, and a thickness from the top surface 307 of the semiconductor substrate 101 to the top surface of the sealing resin 203. These relative thickness area selected so that semiconductor substrate 101 does not warp. For example, the thickness of semiconductor substrate 101 should be selected to be great enough so that semiconductor substrate 101 does not warp responsive to surface tension of sealing resin 203. For removing the rear surface 709, two polishing process are performed. A first polishing is performed by a first grinding wheel that has #325 roughness. After the first polishing, a second polishing process is performed, wherein the rear surface 709 is polished by a second grinding wheel that has #1200 roughness. In conventional manufacturing processing of the WCSP, the second polishing is performed by a grinding wheel that has #2000 roughness. As a result, the rear surface 709 of the semiconductor substrate 101 of the third embodiment is rougher than the rear surface 309 disclosed in the first embodiment. Since the rear surface 709 is rough finished, a top surface 712 of the heat spreading film 311 is rough finished. In this embodiment, the heat spreading film 311 has a top surface 712 roughness that results from the configuration of the rear surface 709 of the semiconductor substrate 101. As a result of the roughness of top surface 712, an area used for radiating heat is increased.

The heat spreading film 311 ranges from 5 μm to 200 μm in thickness. The material of the heat spreading film 311 is the same material as the heat spreading film 311 of the first embodiment. The heat spreading film 311 is formed on the rear surfaces 709 of the semiconductor substrates 101, before the wafer 400 is divided. That is, the heat spreading film 311 is not formed on the respective semiconductor substrates 101 individually. As a result, the productivity of the WCSP is increased.

Fourth Preferred Embodiment

Figure 9A:
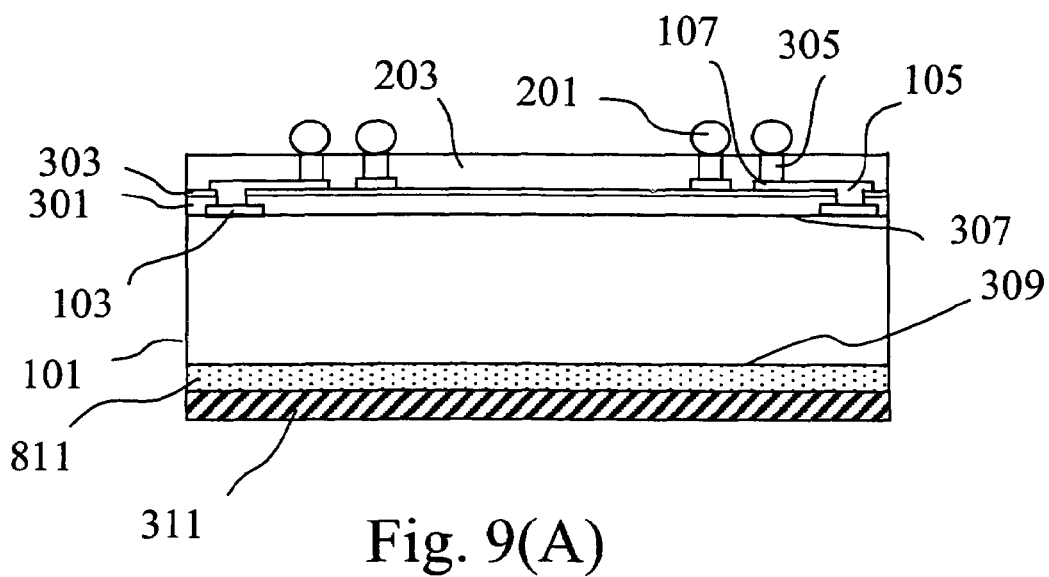
FIG. 9(A) is a cross-sectional view showing a semiconductor device of a fourth embodiment of the present invention.
Figure 9B:
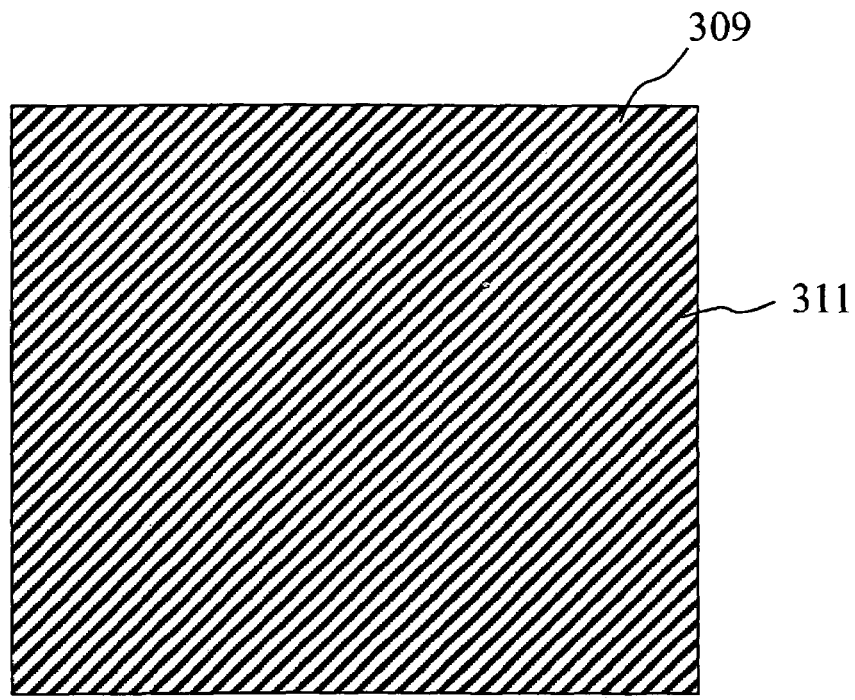
FIG. 9(B) is a plane view showing a rear surface of the semiconductor device of the fourth embodiment of the present invention.

FIG. 9 is a cross-sectional view showing a semiconductor device 800 related to a fourth embodiment of the present invention. FIG. 9(B) is a plane view showing a rear surface 309 of the semiconductor device 800 related to the fourth embodiment of the present invention.

The semiconductor device 800 of the fourth embodiment has a heat conduction film 811 between the rear surface 309 of the semiconductor substrate 101 and the heat spreading film 311. Other components are the same as disclosed in the first embodiment.

The heat conduction film 811 is made from metal such as aluminum. The conduction film 811 is formed about 2 μm thick by a sputtering technique. A heat conductance of the aluminum is 229 W/mK, which is higher than that of silicon which is 150 W/mK, or than that of sealing resin which is 0.70 W/mk. Also, the heat conductance of the heat conduction film 811 is higher than that of the heat spreading film 311. For example, copper can be used as the heat conduction film 811. Copper used as the heat conduction film 811 can be made by an evaporation method or a sputtering method.

The heat conduction film 811 is operated as a pump. That is, the heat conduction film 811 absorbs the heat which is generated in the semiconductor substrate 101 effectively, and transfers the heat to the heat spreading film 311. As a result, the heat generated in the semiconductor device 101 is radiated from the heat spreading film 311 effectively.

The heat conduction film 811 and the heat spreading film 311 are formed on the rear surface 309 of the semiconductor substrate 101, before the semiconductor device 800 is divided. That is, the heat conduction film 811 and the heat spreading film 311 are not formed on the respective semiconductor substrates 101 individually. As a result, the productivity of the WCSP is increased.

Fifth Preferred Embodiment

Figure 10A:
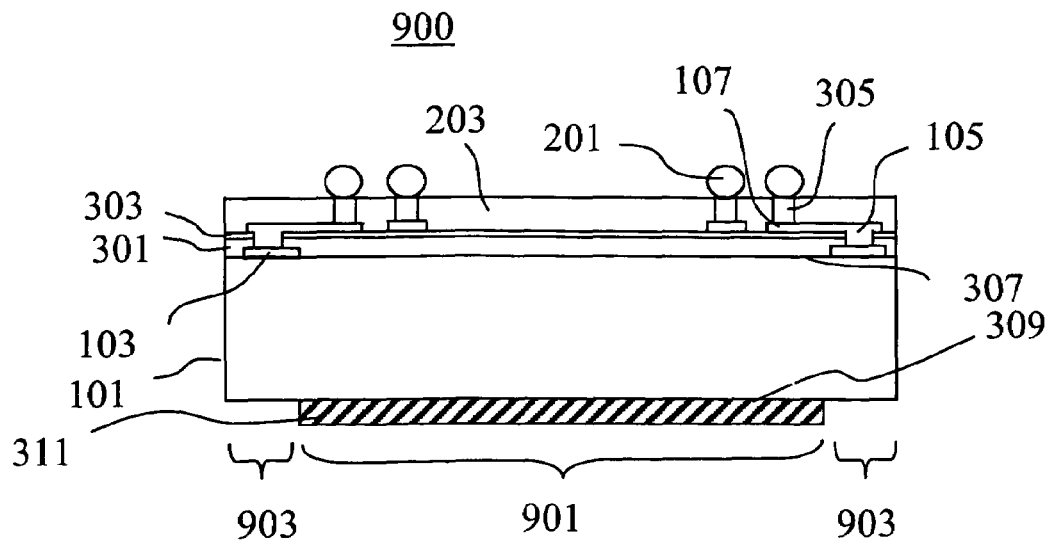
FIG. 10(A) is a cross-sectional view showing a semiconductor device of a fifth embodiment of the present invention.
Figure 10B:
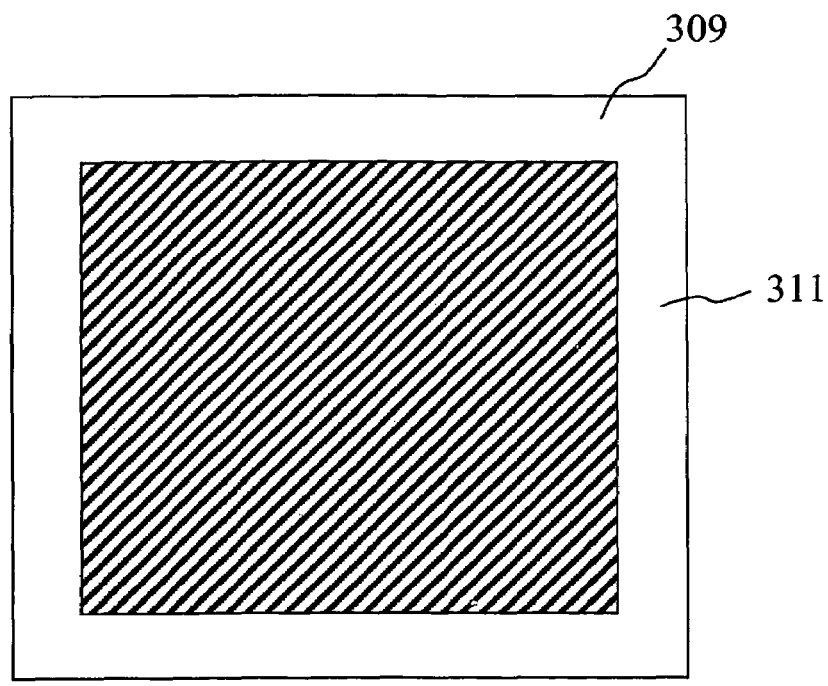
FIG. 10(B) is a plane view showing a rear surface of the semiconductor device of the fifth embodiment of the present invention.

FIG. 10 is a cross-sectional view showing a semiconductor device 900 related to a fifth embodiment of the present invention. FIG. 10(B) is a plane view showing a rear surface 309 of the semiconductor device 900 related to the fifth embodiment of the present invention.

In the sixth embodiment, an arrangement of the heat spreading film 311 is different from an arrangement of the heat spreading film 311 disclosed in the first embodiment. Other components are the same as disclosed in the first embodiment.

The heat spreading film 311 is formed at a central portion of the rear surface 309 of the semiconductor substrate 101. That is, the heat spreading film 311 is not formed at peripheral portions 903 of the rear surface 309 of the semiconductor substrate 101.

A thickness or a material of the heat spreading film 311 is the same as that of the heat spreading film 311 of the first embodiment.

Now, a method for fabricating the semiconductor device 900 of the fifth embodiment is described with reference to FIGS. 4, 11(A) to 11(E) and 12.

Figure 12:
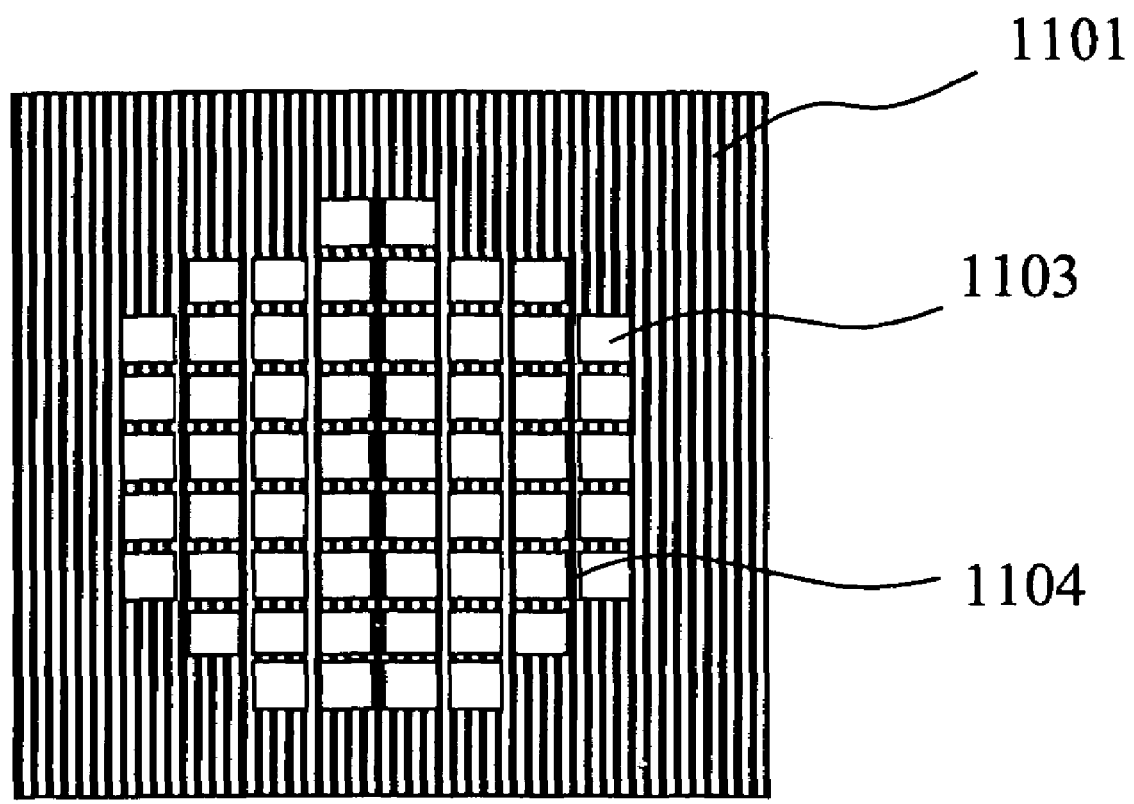
FIG. 12 is a plane view showing a metal mask.

FIG. 11(A) to FIG. 11(E) are views showing fabricating steps for a semiconductor device 900 related to the fifth embodiment of the invention. In these figures, a part of the contents are omitted, for example, the electrode pad 103 is not shown in FIGS. 11(A) to 11(E). FIG. 12 is a plane view showing a metal mask 1101.

First, the semiconductor wafer 400 as shown in FIG. 4 is prepared. The semiconductor device forming areas 401 are defined by the scribe lines 403 on the semiconductor wafer 400. The semiconductor device 900 is made from one of the semiconductor device forming areas 401.

Next, the insulating layer 301, the passivation layer 303, the redistributions 105, the post electrodes 305 and the sealing resin 203 are formed on the front surface 307 of the semiconductor wafer 401. The process steps are disclosed in Japanese Patent No. 3313547.

Then, a metal mask 1101 which has a plurality of openings 1103 as shown in FIG. 12 is prepared. The openings 1103 are divided by grid areas 1104. Each of the openings 1103 is a little smaller than each area of the semiconductor device forming areas 401.

The grid areas 1104 of metal mask 1101 are aligned to the corresponding grid areas 403 by using an infrared camera. That is, each of the openings 1103 is arranged on a central portion of the semiconductor forming areas 401. As a result, a peripheral area of the rear surface 309 of the semiconductor device 101 which includes the scribe lines 403 is masked by the metal mask 1101 as shown in FIG. 11(A).

Next, the heat spreading film 311 is formed on the rear surface 309 of the semiconductor wafer 400. Since an initial condition of the heat spreading film 311 is a liquid state, the heat spreading film 311 in liquid state is coated on the rear surface 309 of the semiconductor wafer 400 by using a squeegee 1001 and the metal mask 1101. Accordingly, the peripheral area 903 is masked by the metal mask 1101, the heat spreading film 311 is formed only at the central portion 901 on the rear surface 309. Then, the heat spreading film 311 in liquid state is dried and solidified as shown in FIG. 11(B).

Next, the metal mask 1101 is removed from the semiconductor wafer 400 as shown in FIG. 11(C).

Then, the external terminals 201 are formed on the post electrodes 305 as shown in FIG. 11(D). The external terminals 201 are formed before dividing the semiconductor wafer 400. In the alternative, the external electrodes 201 can be formed at the step which is shown in FIG. 11(A).

Then, the semiconductor wafer 400 is cut by a dicing blade 501 at the scribe lines 403 as shown in FIG. 11(E).

In the step which is shown in FIG. 11(E), the dicing blade 501 does not cut the heat spreading film 311. As a result, a lifetime of the dicing blade 501 can be extended. Further, a peeling of the heat spreading film 311 is inhibited.

Sixth Preferred Embodiment

The sixth embodiment describes another method for fabricating the semiconductor device 900 as shown in FIG. 10.

FIG. 13(A) to FIG. 13(D) are views showing fabricating steps for a semiconductor device 900 related to a sixth embodiment of the invention. In these figures, a part of contents are omitted.

First, the semiconductor wafer 400 as shown in FIG. 4 is prepared. The semiconductor device forming areas 401 are defined by the scribe lines 403 on the semiconductor wafer 400. The semiconductor device 900 is made from one of the semiconductor device forming areas 401.

Figure 13:
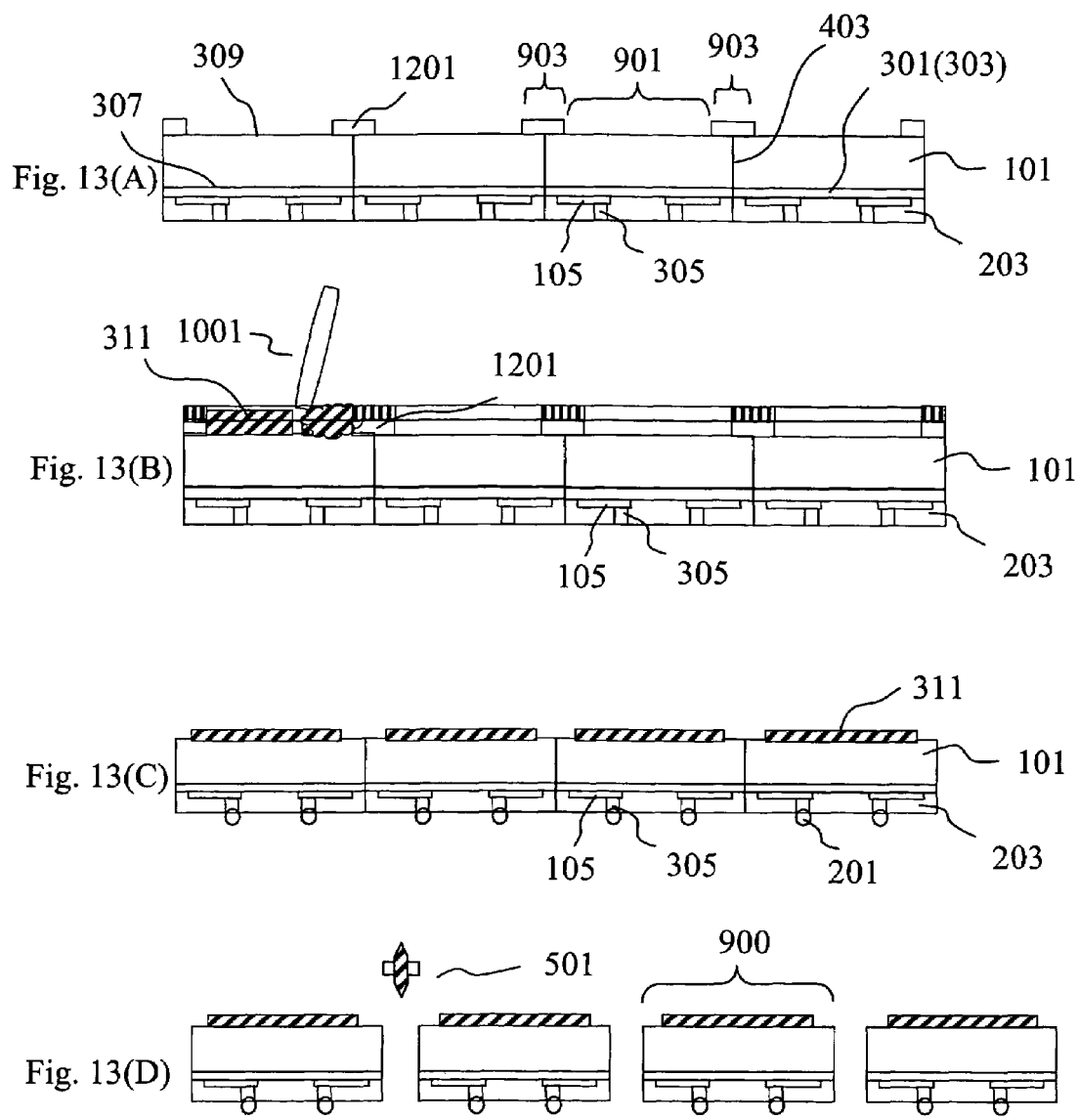
FIGS. 13(A) to 13(D) are views showing fabricating steps for a semiconductor device of a sixth embodiment of the invention.

Next, the insulating layer 301, the passivation layer 303, the redistributions 105, the post electrodes 305 and the sealing resin 203 are formed on the front surface 307 of the semiconductor wafer 401. The process steps are disclosed in the reference of Japanese Patent No. 3313547. Then, a photoresist 1201 is formed on the peripheral areas 903 of the respective semiconductor substrate 101 by a photolithography technique. The photoresist 1201 is arranged on the scribe lines 403 as shown in FIG. 13(A). That is, the photoresist 1201 surrounds the central portion 901 of the semiconductor forming area 401.

Then, the metal mask 1101 which has a plurality of openings 1103 as shown in FIG. 12 is prepared. The openings 1103 are divided by grid areas 1104. Each of the openings 1103 is a little smaller than each area of the semiconductor device forming areas 401.

The grid areas 1104 of metal mask 1101 are aligned to the corresponding photoresist 1201 on the grid areas 403 by using an infrared camera. That is, each of the openings 1103 is arranged at a central portion of the semiconductor forming areas 401. As a result, a peripheral area of the rear surface 309 of the semiconductor device 101 which includes the scribe lines 403 is masked by the photoresist 1201 and the metal mask 1101 as shown in FIG. 13(B).

Since the photoresist 1201 is formed by the photolithography technique, the arrangement of the photoresist 1201 on the rear surface 309 of the semiconductor substrate 101 is accurate. That is, an accuracy of alignment of the metal mask 1101 is less necessary.

Next, the heat spreading film 311 is formed on the rear surface 309 of the semiconductor wafer 400. Since an initial condition of the heat spreading film 311 is a liquid state, the heat spreading film 311 in liquid state is coated on the rear surface 309 of the semiconductor wafer 400 by using a squeegee 1001 and the metal mask 1101. Accordingly, the peripheral area 903 is masked by the photoresist 1201 and the metal mask 1101, the heat spreading film 311 is formed only at the central portion 901 on the rear surface 309. Then, heat spreading film 311 in liquid state is dried and solidified as shown in FIG. 13(B).

Next, the metal mask 1101 is removed from the semiconductor wafer 400, and the photoresist 1201 is removed by using a solvent. Then, the external terminals 201 are formed on the post electrodes 305 as shown in FIG. 13(C). The external terminals 201 are formed before dividing the semiconductor wafer 400. In the alternative, the external electrodes 201 can be formed at the step which is shown in FIG. 13(A).

Then, the semiconductor wafer 400 is cut by a dicing blade 501 at the scribe lines 403 as shown in FIG. 13(D). In this embodiment, the photoresist 1201 can be cut with the scribe lines 403 by the dicing blade 501, without removal thereof using a solvent.

In the step which is shown in FIG. 13(D), the dicing blade 501 does not cut the heat spreading film 311. As a result, a lifetime of the dicing blade 501 can be extended. Further, a peeling of the heat spreading film 311 is inhibited. Further, the accuracy of the alignment of the heat spreading film 311 is improved.

Seventh Preferred Embodiment

The seventh embodiment describes another method for fabricating the semiconductor device 900 as shown in FIG. 10.

FIG. 14(A) to FIG. 14(D) are views showing fabricating steps for a semiconductor device 900 related to seventh embodiment of the invention. In these figures, a part of contents are omitted.

First, the semiconductor wafer 400 as shown in FIG. 4 is prepared. The semiconductor device forming areas 401 are defined by the scribe lines 403 on the semiconductor wafer 400. The semiconductor device 900 is made from one of the semiconductor device forming areas 401.

Next, the insulating layer 301, the passivation layer 303, the redistributions 105, the post electrodes 305 and the sealing resin 203 are formed on the front surface 307 of the semiconductor wafer 401. The process steps are disclosed in Japanese Patent No. 3313547. Then, a photoresist 1201 is formed on the peripheral areas 903 by a photolithography technique. The photoresist 1201 is arranged an the scribe lines 403, and is arranged around the central portion 901 of the semiconductor forming area 401 as shown in FIG. 14(A).

Figure 14:
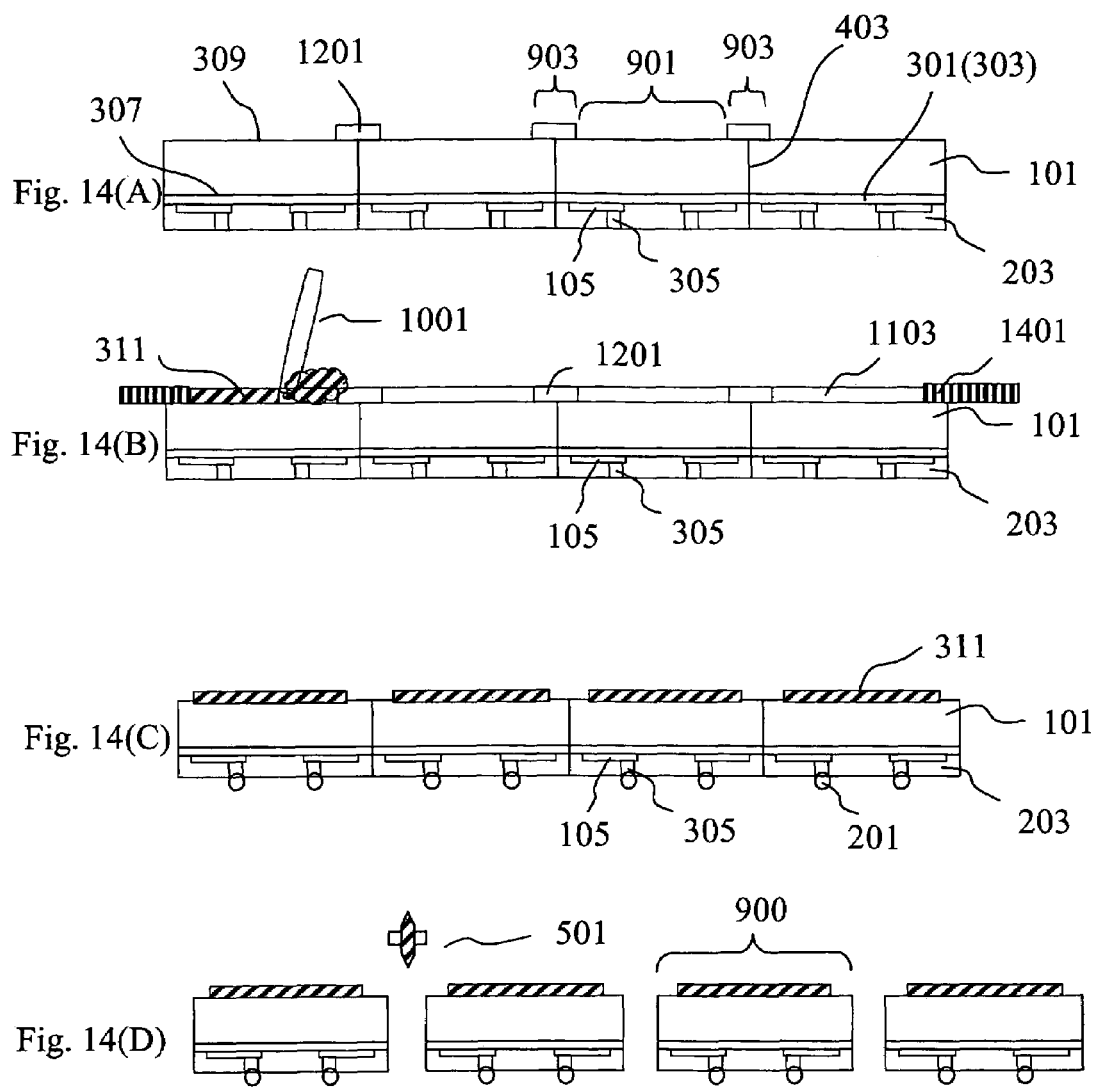
FIGS. 14(A) to 14(D) are views showing fabricating steps for a semiconductor device of a seventh embodiment of the invention.
Figure 15:
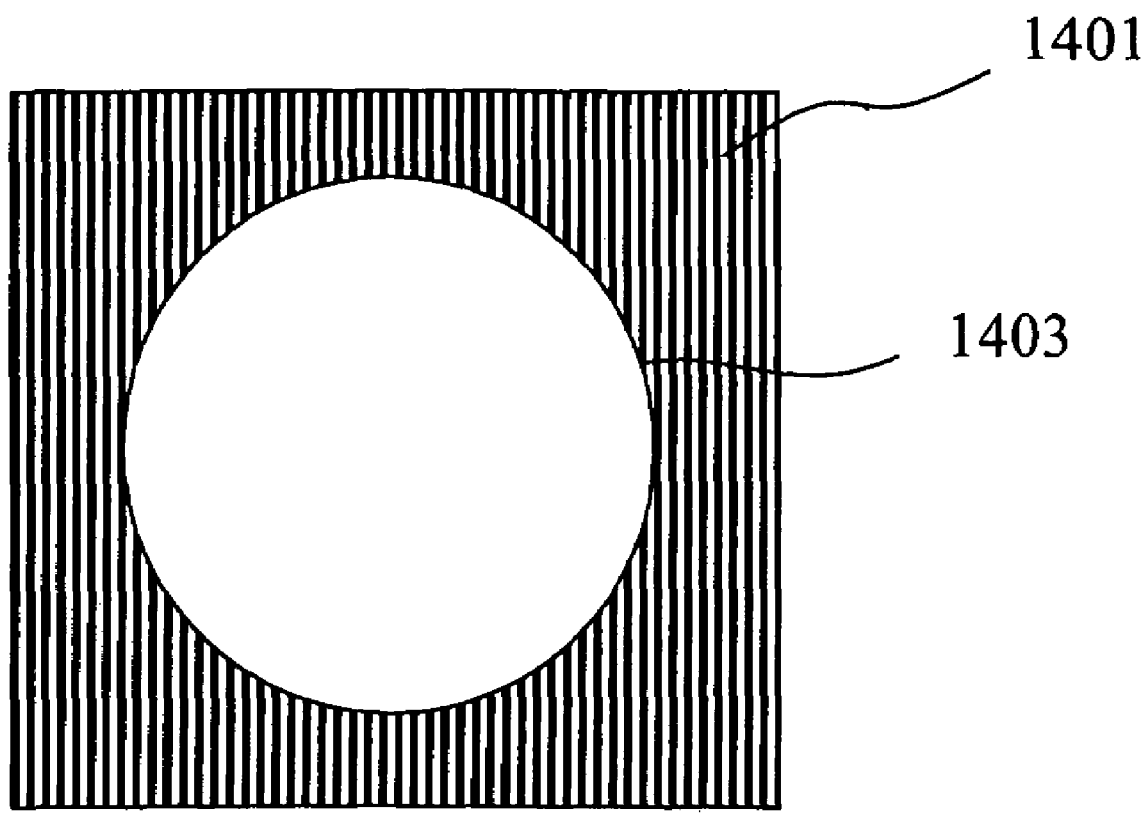
FIG. 15 is a plane view showing a metal mask.

Then, a metal mask 1401 which has an opening 1403 as shown in FIG. 15, is set on the semiconductor wafer 400. A size of the opening is smaller than a size of the semiconductor wafer 400. As a result, a peripheral area of the rear surface 309 of the semiconductor wafer 400 is masked by the metal mask 1401 as shown in FIG. 14(B).

Next, the heat spreading film 311 is formed on the rear surface 309 of the semiconductor wafer 400. Since an initial condition of the heat spreading film 311 is a liquid state, the heat spreading film 311 in liquid state is coated on the rear surface 309 of the semiconductor wafer 400 by using a squeegee 1001 and the metal mask 1401. Accordingly, the peripheral area 903 is masked by the photoresist 1201, the heat spreading film 311 is formed only the central portion 901 on the rear surface 309. Then, the heat spreading film 311 in liquid state is dried and solidified as shown in FIG. 14(B).

In the step disclosed in FIG. 14(B), the height of the mask 1401 is the same as the height of the photoresist 1201. The squeegee 1001 supplies the heat spreading material 311 in liquid state so that the spaces between the photoresist 1201 is filled with the heat spread material, and so that the heat spreading material does not remain on the top surfaces of the photoresist. As a result, an alignment between the metal mask 1401 and the scribe lines 403 is not needed. That is, only an alignment between the opening 1403 and the peripheral area of the semiconductor wafer 400 is needed. Therefore, an accuracy of the alignment between the metal mask 1401 and the semiconductor wafer 400 is reduced.

Next, the metal mask 1401 is removed from the semiconductor wafer 400, and the photoresist 1201 is removed by using a solvent. Before the photoresist 1201 is removed, some heat spreading film 311 may remaine on the photoresist 1201.

However, the remaining heat spreading film is very thin. Therefore, the remaining heat spreading film can be removed with the photoresist 1201 by the solvent. Then, the external terminals 201 are formed on the post electrodes 305 as shown in FIG. 14(C). The external terminals 201 are formed before dividing the semiconductor wafer 400. In the alternative, the external electrodes 201 can be formed at the step which is shown in FIG. 14(A).

Then, the semiconductor wafer 400 is cut by a dicing blade 501 at the scribe lines 403 as shown in FIG. 14(D). In an alternative embodiment, the photoresist 1201 is not removed by using the solvent. In this alternative embodiment, the photoresist 1201 may be removed by cutting at the scribe lines 403 by the dicing blade 501.

In the step which is shown in FIG. 14(D), the dicing blade 501 does not cut the heat spreading film 311. As a result, a lifetime of the dicing blade 501 can be extended. Further, a peeling of the heat spreading film 311 is inhibited. Further, the accuracy of the alignment of the heat spreading film 311 is improved.

Eighth Preferred Embodiment

The eighth embodiment describes another method for fabricating the semiconductor device 900 as shown in FIG. 10.

FIGS. 16(A) to FIG. 16(E) are views showing fabricating steps for a semiconductor device 900 related to an eighth embodiment of the invention. In these figures, a part of contents are omitted.

First, the semiconductor wafer 400 as shown in FIG. 4 is prepared. The semiconductor device forming areas 401 are defined by the scribe lines 403 on the semiconductor wafer 400. The semiconductor device 900 is made from one of the semiconductor device forming areas 401.

Figure 16:
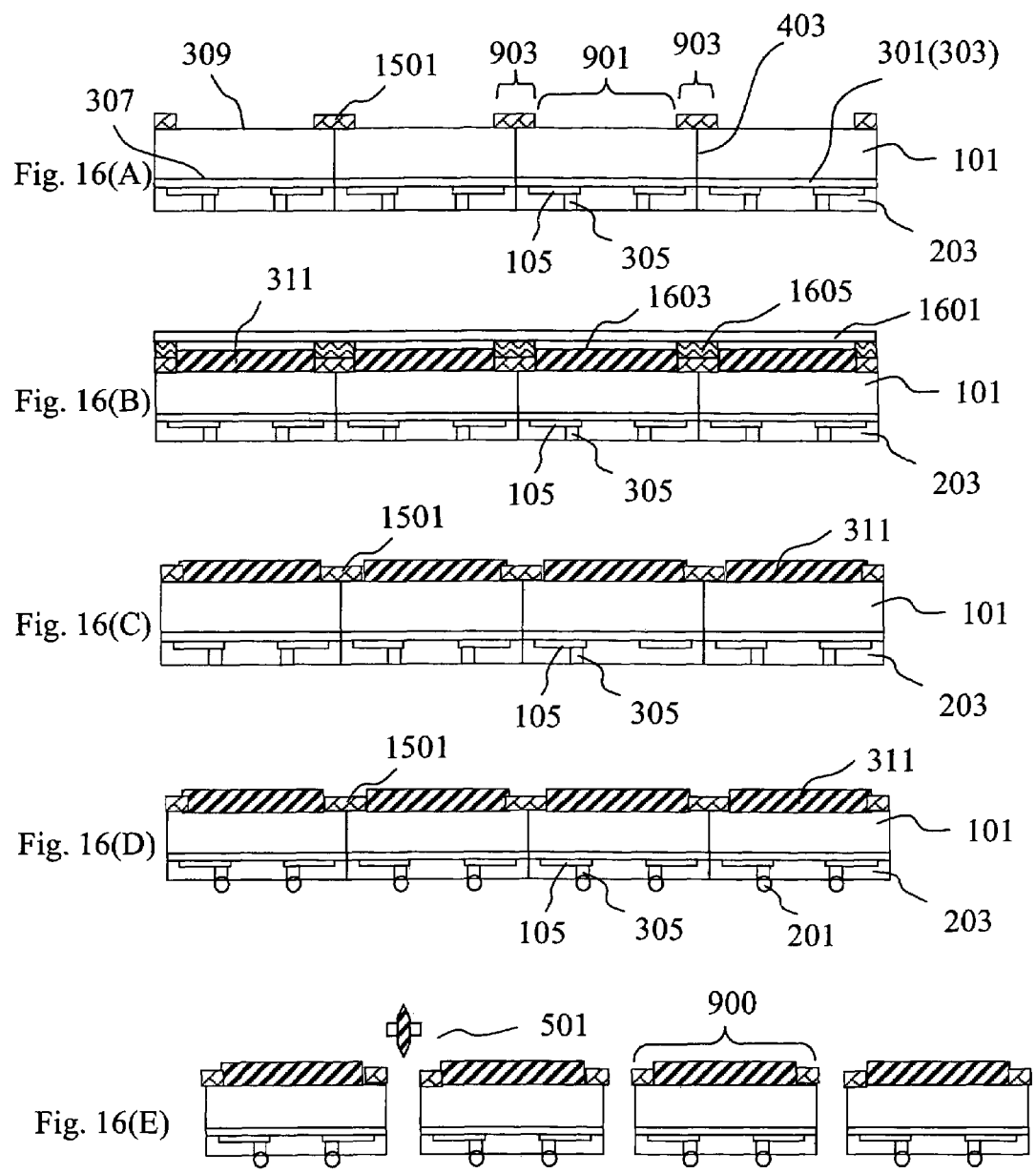
FIGS. 16(A) to 16(E) are views showing fabricating steps for a semiconductor device of an eighth embodiment of the invention.

Next, the insulating layer 301, the passivation layer 303, the redistributions 105, the post electrodes 305 and the sealing resin 203 are formed on the front surface 307 of the semiconductor wafer 401. The process steps are disclosed in Japanese Patent No. 3313547. Then, a water repellent film 1501 is formed on the rear surface 309 of the semiconductor wafer 400 by printing or spray coating. The water repellent film 1501 is selectively formed on the peripheral area 903 including on the scribe line 403. An organic thin film including fluorine can be used as the water repellent film 1501. The water repellent film 1501 is formed around peripheral areas 903 of each central portion 901 of the semiconductor device forming areas 401 as shown in FIG. 16(A).

Next, the heat spreading film 311 is formed on the rear surface 309 of the semiconductor wafer 400. The heat spreading film 311 is supplied on the rear surface 309 of the semiconductor wafer 400 by a spray coating or a printing.

Figure 17:
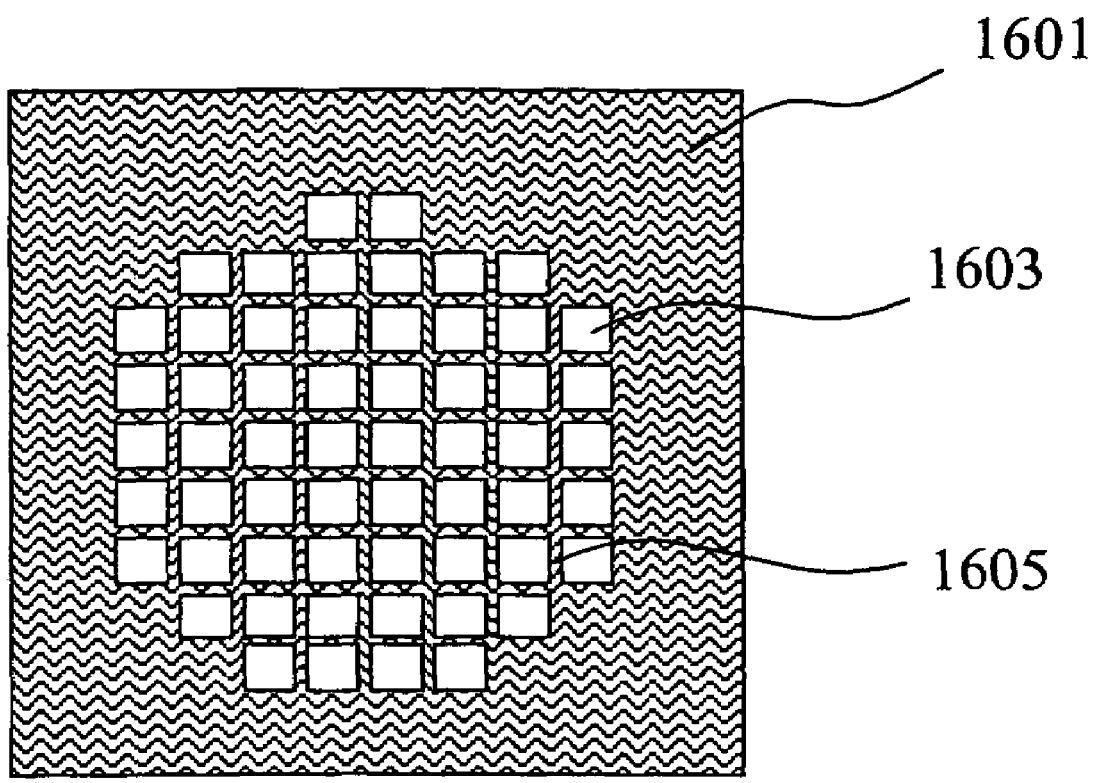
FIG. 17 is a plane view showing a stamper.

Next, a stamper 1601 which has a plurality of openings 1603 as illustrated in FIG. 17 is provided. An area of the opening 1603 is smaller than that of the semiconductor forming area 401. A stamp portion 1605 which is finished so as to water repellent is arranged between each openings 1603.

Next, the stamper 1601 is aligned to the scribe lines 403 by using an infrared camera. That is, each of the openings 1603 is arranged on a central portion of the semiconductor forming areas 401. The stamp portion 1605 is touched to the water repellent film 1501. As a result, the heat spreading film 311 remaining on the water repellent film 1501 is push out to the central area 901 as shown in FIG. 16(B).

Next, the stamper 1601 is removed and the semiconductor wafer is heated. The heat spreading film 311 in liquid state is dried and solidified as shown in FIG. 16(C).

Then, the external terminals 201 are formed on the post electrodes 305 as shown in FIG. 16(D). The external terminals 201 are formed before dividing the semiconductor wafer 400. In the alternative, the external electrodes 201 can be formed at the step which is shown in FIG. 16(A).

Then, the semiconductor wafer 400 is cut by a dicing blade 501 at the scribe lines 403 as shown in FIG. 16(E).

In the step which is shown in FIG. 16(E), the dicing blade 501 does not cut the heat spreading film 311. As a result, a lifetime of the dicing blade 501 can be extended. Further, a peeling of the heat spreading film 311 is inhibited.

Ninth Preferred Embodiment

The ninth embodiment describes another method for fabricating the semiconductor device 900 as shown in FIG. 10.

FIGS. 18(A) to FIG. 18(D) are views showing fabricating steps for a semiconductor device 900 related to a ninth embodiment of the invention. In these figure, a part of contents are omitted.

First, the semiconductor wafer 400 as shown in FIG. 4 is prepared. The semiconductor device forming areas 401 are defined by the scribe lines 403 on the semiconductor wafer 400. The semiconductor device 900 is made from one of the semiconductor device forming areas 401.

Figure 18A:
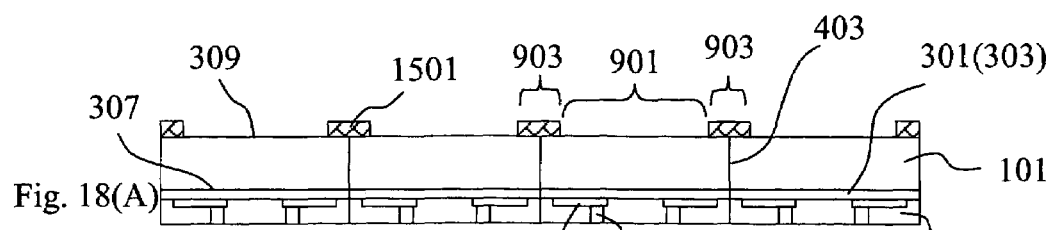
FIGS. 18(A) to 18(D) are views showing fabricating steps for a semiconductor device of a ninth embodiment of the invention.

Next, the insulating layer 301, the passivation layer 303, the redistributions 105, the post electrodes 305 and the sealing resin 203 are formed on the front surface 307 of the semiconductor wafer 401. The process steps are disclosed in Japanese Patent No. 3313547. Then, a water repellent film 1501 is formed on the rear surface 309 of the semiconductor wafer 400 by printing or spray coating. The water repellent film 1501 is selectively formed on the peripheral area 903 including on the scribe line 403. An organic thin film including fluorine can be used as the water repellent film 1501. The water repellent film 1501 is formed around peripheral areas 903 of each central portion 901 of the semiconductor device forming areas 401 as shown in FIG. 18(A).

Next, an adhesive tape 1701 is attached to the surface of the semiconductor wafer 400. A grind tape can be used as the adhesive tape 1701.

The semiconductor wafer 400 attached the adhesive tape 1701 is dipped into a tank which is filled a heat spreading material in liquid state. Then, the semiconductor wafer 400 is removed from the tank. The liquid heat spreading material remains on the surface 309 of the semiconductor wafer 400. The heat spreading film 311 in liquid state is dried and solidified.

Figure 18B:
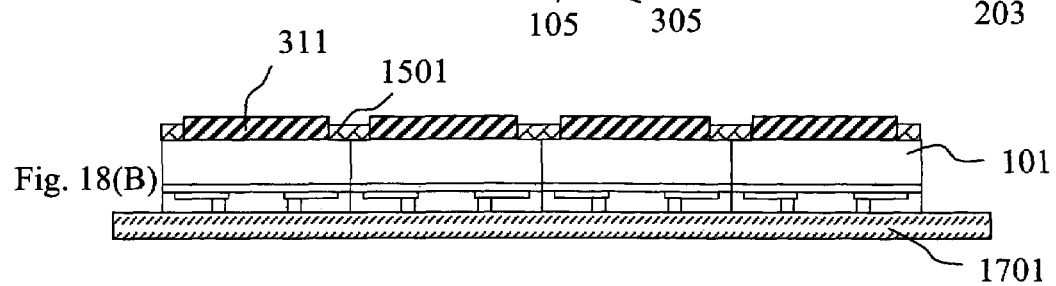

The heat spreading film 311 in liquid state is repelled from the water repellent film 1501 when the semiconductor wafer 400 is removed from the tank. Therefore, the heat spreading film 311 in liquid state selectively remains on the central portion 901 of the semiconductor wafer 400. The dipping step and the drying step are repeated, and the predetermined thickness of the heat spreading film 311 is formed as shown in FIG. 18(B).

Figure 18C:
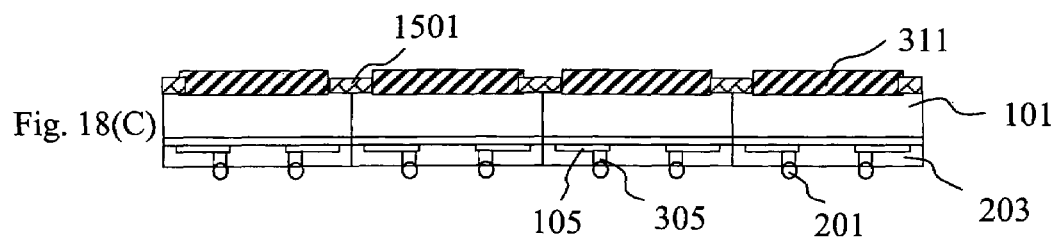

Then, the external terminals 201 are formed on the post electrodes 305 as shown in FIG. 18(C). The external terminals 201 are formed before dividing the semiconductor wafer 400. In the alternative, the external electrodes 201 can be formed at the step which is shown in FIG. 18(A).

Figure 18D:
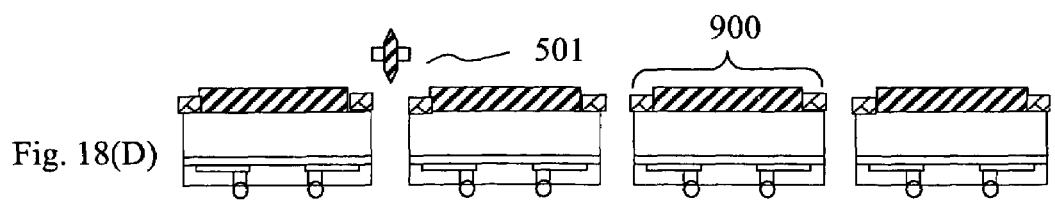

Then, the semiconductor wafer 400 is cut by a dicing blade 501 at the scribe lines 403 as shown in FIG. 18(D).

In the step which is shown in FIG. 18(D), the dicing blade 501 does not cut the heat spreading film 311. As a result, a lifetime of the dicing blade 501 can be extended. Further, a peeling of the heat spreading film 311 is inhibited.

Tenth Preferred Embodiment

Figure 19A:
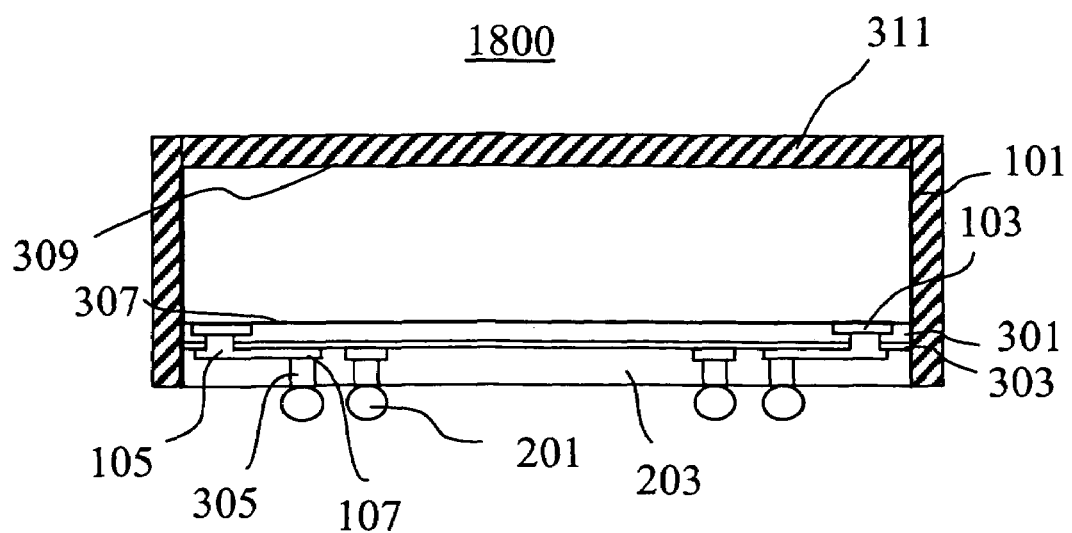
FIG. 19(A) is a cross-sectional view showing a semiconductor device of a tenth embodiment of the present invention.
Figure 19B:
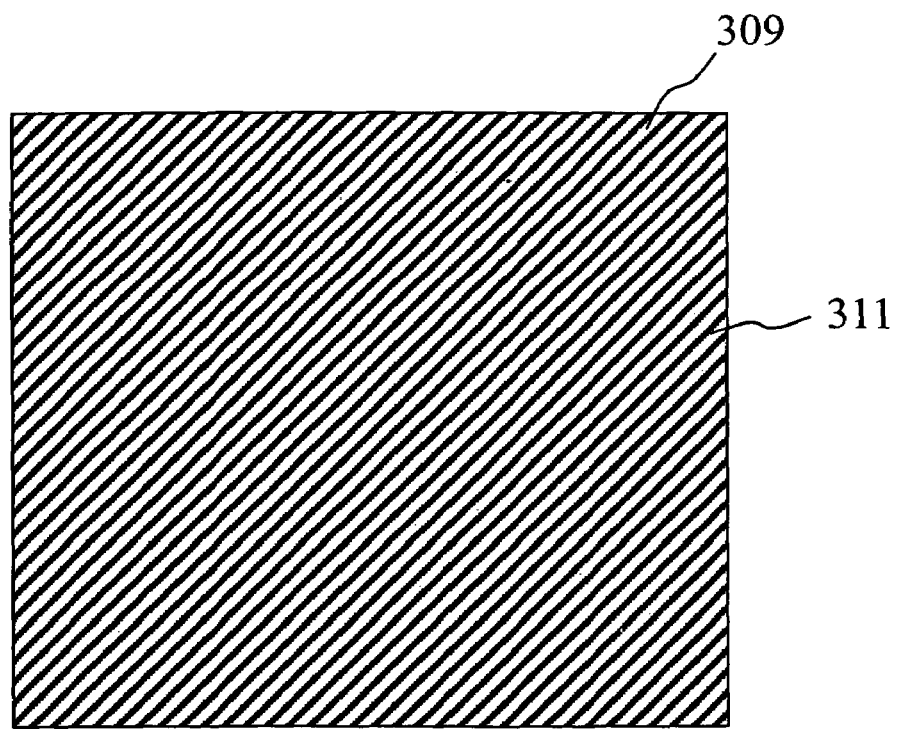
FIG. 19(B) is a plane view showing a rear surface of the semiconductor device of the tenth embodiment of the present invention.

FIGS. 19(A) and 19(B) are cross-sectional views showing a semiconductor device 1800 related to a tenth embodiment of the present invention. FIG. 19(B) is a plane view showing a rear surface 309 of the semiconductor device 1800 related to the tenth embodiment of the present invention.

FIGS. 20(A) to 20(E) are views showing fabricating steps for a semiconductor device 1800 related to tenth embodiment of the invention. In these figures, a part of contents are omitted.

The heat spreading film 311 is formed on the rear surface 309 and side surfaces of the semiconductor substrate 101 as shown in FIG. 19(A). The heat spreading film 311 ranges from 5 μm to 200 μm in thickness. A heat radiating ratio of the heat spreading film 311 is higher than that of the semiconductor substrate 101.

Since, the heat spreading film 311 is also formed on the side surfaces of the semiconductor substrate 101, an area of the heat radiating is larger than that of the semiconductor device shown in the first embodiment.

Now, a method for fabricating the semiconductor device 1800 of the tenth preferred embodiment is described.

The semiconductor wafer 400 is provided. A plurality of semiconductor device forming areas 401 is defined by scribe lines 403 on the semiconductor wafer 400.

The insulating layer 301, the passivation layer 303, the redistributions 105, the post electrodes 305 and the sealing resin 203 are formed on the front surface 307 of the semiconductor wafer 401 as shown in FIG. 20(A). The process steps are disclosed in Japanese Patent No. 3313547.

Next, an adhesive tape 1701 such a grind tape is attached to the surface of the semiconductor wafer 400. Then, the semiconductor wafer 400 is cut by the dicing blade 501 at the scribe lines 403 as shown in FIG. 20(B). Then, the adhesive tape 1701 is expanded. That is, the distance between each semiconductor substrate 101 is increased as shown in FIG. 20(C).

Next, a heat spreading material in liquid state is sprayed on the rear surface 309 and the side surfaces of the semiconductor substrate. Then, the heat spreading film 311 in liquid state is dried and solidified as shown in FIG. 20(D). The space between each of the semiconductor device is not completely embedded by the heat spreading film 311.

Next, the adhesive tape 1701 is removed. Then, the external terminals 201 can be formed on the post electrodes 305 as shown in FIG. 20(E). The external terminals 201 in the alternative can be formed before dividing the semiconductor wafer 400. That is, the external electrodes 201 can be formed at the step which is shown in FIG. 20(A).

Accordingly, the heat spreading film 311 is also formed on the side surfaces of the semiconductor device 101, so that the heat generated in the semiconductor device 101 is radiated effectively.

While the preferred form of the present invention has been described, it is to be understood that modifications will be apparent to those skilled in the art without departing from the spirit of the invention. The scope of the invention is to be determined solely by the following claims.

What is claimed is:

1. A method of fabricating a semiconductor device comprising:

providing a semiconductor wafer having a first surface and a second surface opposite of the first surface, the first surface having a plurality of circuit elements each of which is defined by scribe lines formed in the semiconductor wafer;

forming a sealing resin on the first surface of the semiconductor wafer;

forming a plurality of external terminals on the first surface of the semiconductor wafer, the external terminals respectively electrically connect to the circuit elements and project from the sealing resin;

adhering the first surface of the semiconductor wafer to a supporter;

separating the semiconductor wafer at the scribe lines, to divide the semiconductor wafer into a plurality of chips, each of the chips including a top surface corresponding to the first surface of the semiconductor wafer, a bottom surface corresponding to the second surface of the semiconductor wafer, and side surfaces between the top and bottom surfaces; and spraying a heat spreading material on the chips after said separating, to coat the bottom surfaces and side surfaces of the chips with the heat spreading material, wherein the chips remain adhered to the supporter during said spraying.

2. The method according to claim 1, wherein the supporter is an adhesive tape.

3. The method according to claim 2, wherein said separating comprises:
cutting the semiconductor wafer at the scribe lines using a blade to provide the chips; and
stretching the adhesive tape to separate the chips away from each other.

4. The method according to claim 1, wherein said forming a plurality of external terminals occurs before said adhering.

5. The method according to claim 3, wherein said forming a plurality of external terminals occurs before said adhering.

6. The method according to claim 3, further comprising:
removing the adhesive tape after said spraying,
said forming a plurality of external terminals occurs before said removing.

7. A method of fabricating a semiconductor device comprising:
forming a sealing resin on a first surface of a semiconductor wafer, the first surface having circuit elements with scribe lines therebetween and having post electrodes thereon connected to the circuit elements, the post electrodes each having a surface exposed from the sealing layer;
forming external terminals on the exposed surfaces of the post electrodes;
adhering the first surface of the semiconductor wafer to a support;
separating the circuit elements from each other along the scribe lines, to provide a plurality of chips, each of the chips including a top surface corresponding to the first surface of the semiconductor wafer, a bottom surface, and side surfaces between the top and bottom surfaces; and
spraying a heat spreading material on the bottom surface of each of the chips and on the side surfaces of each of the chips, wherein the chips remain adhered to the support during said spraying.

8. The method of claim 7, wherein the support is an adhesive tape.

9. The method of claim 8, wherein said separating comprises:
cutting the semiconductor wafer at the scribe lines using a blade; and
stretching the adhesive tape to separate the cut semiconductor wafer into the chips.

10. The method of claim 9, further comprising:
removing the adhesive tape after said spraying,
said forming external terminals occurs after said removing.

11. The method according to claim 9, wherein said forming a plurality of external terminals occurs before said adhering.

12. The method of claim 7, wherein said forming external terminals occurs before said adhering.

* * * * *